(12) United States Patent
Clark et al.

(10) Patent No.: US 7,749,899 B2
(45) Date of Patent: Jul. 6, 2010

(54) MICROELECTRONIC WORKPIECES AND METHODS AND SYSTEMS FOR FORMING INTERCONNECTS IN MICROELECTRONIC WORKPIECES

(75) Inventors: Douglas Clark, Meridian, ID (US); Steven D. Oliver, Boise, ID (US); Kyle K. Kirby, Eagle, ID (US); Ross S. Dando, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 979 days.

(21) Appl. No.: 11/446,003

(22) Filed: Jun. 1, 2006

(65) Prior Publication Data

US 2007/0281473 A1    Dec. 6, 2007

(51) Int. Cl.
*H01L 21/44* (2006.01)
(52) U.S. Cl. .............................. 438/667; 257/E21.585
(58) Field of Classification Search .................. 438/667, 438/678, 681
See application file for complete search history.

(56) References Cited

U.S. PATENT DOCUMENTS

| | | |
|---|---|---|
| 2,821,959 A | 2/1958 | Franz |
| 3,006,318 A | 10/1961 | Monroe, Jr. et al. |
| 3,345,134 A | 10/1967 | Heymer et al. |
| 3,865,298 A | 2/1975 | Allen et al. |
| 3,902,036 A | 8/1975 | Zaleckas |
| 4,040,168 A | 8/1977 | Huang |
| 4,368,106 A | 1/1983 | Anthony |
| 4,534,100 A | 8/1985 | Lane |
| 4,581,301 A | 4/1986 | Michaelson |
| 4,608,480 A | 8/1986 | Bizot et al. |
| 4,614,427 A | 9/1986 | Koizumi et al. |
| 4,627,971 A | 12/1986 | Ayer |

(Continued)

FOREIGN PATENT DOCUMENTS

DE    10205026 C1    5/2003

(Continued)

OTHER PUBLICATIONS

Aachboun, S. and P. Ranson, "Cryogenic etching of deep narrow trenches in silicon," J. Vac. Sci. Technol. A 18 (4), Jul./Aug. 2000, pp. 1848-1852.

(Continued)

*Primary Examiner*—W. David Coleman
(74) *Attorney, Agent, or Firm*—Perkins Coie LLP

(57) ABSTRACT

Methods and systems for forming electrical interconnects through microelectronic workpieces are disclosed herein. One aspect of the invention is directed to a method of manufacturing an electrical interconnect in a microelectronic workpiece having a plurality of dies. Each die can include at least one terminal electrically coupled to an integrated circuit. The method can include forming a blind hole in a first side of the workpiece, and forming a vent in a second side of the workpiece in fluid communication with the blind hole. The method can further include moving, e.g., by sucking and/or wetting, electrically conductive material into at least a portion of the blind hole by drawing at least a partial vacuum in the vent. In one embodiment, the blind hole can extend through one of the terminals on the workpiece. In this embodiment, the electrically conductive material forms an interconnect that extends through the workpiece and is electrically coupled to the terminal.

55 Claims, 11 Drawing Sheets

U.S. PATENT DOCUMENTS

| | | |
|---|---|---|
| 4,660,063 A | 4/1987 | Anthony |
| 4,756,765 A | 7/1988 | Woodroffe |
| 4,768,291 A | 9/1988 | Palmer |
| 4,959,705 A | 9/1990 | Lemnios et al. |
| 4,964,212 A | 10/1990 | Deroux-Dauphin et al. |
| 4,984,597 A | 1/1991 | McConnell et al. |
| 5,024,966 A | 6/1991 | Dietrich et al. |
| 5,026,964 A | 6/1991 | Somers et al. |
| 5,027,184 A | 6/1991 | Soclof |
| 5,037,782 A | 8/1991 | Nakamura et al. |
| 5,123,902 A | 6/1992 | Muller et al. |
| 5,145,099 A | 9/1992 | Wood et al. |
| 5,158,911 A | 10/1992 | Quentin et al. |
| 5,219,344 A | 6/1993 | Yoder, Jr. |
| 5,233,448 A | 8/1993 | Wu et al. |
| 5,237,148 A | 8/1993 | Aoki et al. |
| 5,289,631 A | 3/1994 | Koopman et al. |
| 5,292,686 A | 3/1994 | Riley et al. |
| 5,294,568 A | 3/1994 | McNeilly et al. |
| 5,378,312 A | 1/1995 | Gifford et al. |
| 5,380,681 A | 1/1995 | Hsu et al. |
| 5,402,435 A | 3/1995 | Shiono et al. |
| 5,406,630 A | 4/1995 | Piosenka et al. |
| 5,424,573 A | 6/1995 | Kato et al. |
| 5,438,212 A | 8/1995 | Okaniwa et al. |
| 5,447,871 A | 9/1995 | Goldstein |
| 5,464,960 A | 11/1995 | Hall et al. |
| 5,496,755 A | 3/1996 | Bayraktaroglu |
| 5,515,167 A | 5/1996 | Ledger et al. |
| 5,518,956 A | 5/1996 | Liu et al. |
| 5,585,308 A | 12/1996 | Sardella |
| 5,585,675 A | 12/1996 | Knopf |
| 5,614,743 A | 3/1997 | Mochizuki et al. |
| 5,624,437 A | 4/1997 | Freeman et al. |
| 5,627,106 A | 5/1997 | Hsu et al. |
| 5,646,067 A | 7/1997 | Gaul |
| 5,654,221 A | 8/1997 | Cronin et al. |
| 5,673,846 A | 10/1997 | Gruber |
| 5,684,642 A | 11/1997 | Zumoto et al. |
| 5,690,841 A | 11/1997 | Elderstig |
| 5,718,791 A | 2/1998 | Spengler et al. |
| 5,723,904 A | 3/1998 | Shiga et al. |
| 5,726,493 A | 3/1998 | Yamashita et al. |
| 5,771,158 A | 6/1998 | Yamagishi et al. |
| 5,773,359 A | 6/1998 | Mitchell et al. |
| 5,776,824 A | 7/1998 | Farnworth et al. |
| 5,807,439 A | 9/1998 | Akatsu et al. |
| 5,811,799 A | 9/1998 | Wu |
| 5,821,532 A | 10/1998 | Beaman et al. |
| 5,825,080 A | 10/1998 | Imaoka et al. |
| 5,826,628 A | 10/1998 | Hamilton |
| 5,847,454 A | 12/1998 | Shaw et al. |
| 5,851,845 A | 12/1998 | Wood et al. |
| 5,857,963 A | 1/1999 | Pelchy et al. |
| 5,861,654 A | 1/1999 | Johnson |
| 5,870,289 A | 2/1999 | Tokuda et al. |
| 5,870,823 A | 2/1999 | Bezama et al. |
| 5,893,828 A | 4/1999 | Uram |
| 5,904,499 A | 5/1999 | Pace |
| 5,969,422 A | 10/1999 | Ting et al. |
| 5,998,240 A | 12/1999 | Hamilton et al. |
| 5,998,292 A | 12/1999 | Black et al. |
| 6,004,867 A | 12/1999 | Kim et al. |
| 6,008,070 A | 12/1999 | Farnworth |
| 6,008,914 A | 12/1999 | Sasagawa et al. |
| 6,080,291 A | 6/2000 | Woodruff et al. |
| 6,097,087 A | 8/2000 | Farnworth et al. |
| 6,103,547 A | 8/2000 | Corisis et al. |
| 6,107,180 A | 8/2000 | Munroe et al. |
| 6,107,679 A | 8/2000 | Noguchi et al. |
| 6,110,825 A | 8/2000 | Mastromatteo et al. |
| 6,114,240 A | 9/2000 | Akram et al. |
| 6,119,335 A | 9/2000 | Park et al. |
| 6,124,634 A | 9/2000 | Akram et al. |
| 6,130,141 A | 10/2000 | Degani et al. |
| 6,133,622 A | 10/2000 | Corisis et al. |
| 6,137,182 A | 10/2000 | Hause et al. |
| 6,140,604 A | 10/2000 | Somers et al. |
| 6,143,588 A | 11/2000 | Glenn |
| 6,148,509 A | 11/2000 | Schoenfeld et al. |
| 6,159,764 A | 12/2000 | Kinsman et al. |
| 6,180,518 B1 | 1/2001 | Layadi et al. |
| 6,184,465 B1 | 2/2001 | Corisis |
| 6,187,615 B1 | 2/2001 | Kim et al. |
| 6,191,487 B1 | 2/2001 | Rodenbeck et al. |
| 6,203,539 B1 | 3/2001 | Shimmick et al. |
| 6,222,136 B1 | 4/2001 | Appelt et al. |
| 6,222,270 B1 | 4/2001 | Lee |
| 6,228,687 B1 | 5/2001 | Akram et al. |
| 6,229,202 B1 | 5/2001 | Corisis |
| 6,235,552 B1 | 5/2001 | Kwon et al. |
| 6,246,108 B1 | 6/2001 | Corisis et al. |
| 6,252,300 B1 | 6/2001 | Hsuan et al. |
| 6,268,114 B1 | 7/2001 | Wen et al. |
| 6,271,580 B1 | 8/2001 | Corisis |
| 6,277,757 B1 | 8/2001 | Lin et al. |
| 6,291,894 B1 | 9/2001 | Farnworth et al. |
| 6,294,837 B1 | 9/2001 | Akram et al. |
| 6,297,155 B1 | 10/2001 | Simpson et al. |
| 6,324,253 B1 | 11/2001 | Yuyama et al. |
| 6,326,689 B1 | 12/2001 | Thomas |
| 6,326,697 B1 | 12/2001 | Farnworth |
| 6,329,632 B1 | 12/2001 | Fournier et al. |
| 6,341,009 B1 | 1/2002 | O'Connor et al. |
| 6,344,976 B1 | 2/2002 | Schoenfeld et al. |
| 6,359,254 B1 | 3/2002 | Brown |
| 6,359,328 B1 | 3/2002 | Dubin |
| 6,372,548 B2 | 4/2002 | Bessho et al. |
| 6,391,770 B2 | 5/2002 | Kosaki et al. |
| 6,406,636 B1 | 6/2002 | Vaganov |
| 6,432,821 B1 | 8/2002 | Dubin et al. |
| 6,433,303 B1 | 8/2002 | Liu et al. |
| 6,437,284 B1 | 8/2002 | Okamoto et al. |
| 6,437,441 B1 | 8/2002 | Yamamoto et al. |
| 6,441,487 B2 | 8/2002 | Elenius et al. |
| 6,452,270 B1 | 9/2002 | Huang et al. |
| 6,457,515 B1 | 10/2002 | Vafai et al. |
| 6,459,039 B1 | 10/2002 | Bezama et al. |
| 6,468,889 B1 | 10/2002 | Iacoponi et al. |
| 6,486,083 B1 | 11/2002 | Mizuno et al. |
| 6,486,549 B1 | 11/2002 | Chiang et al. |
| 6,521,516 B2 | 2/2003 | Monzon et al. |
| 6,521,530 B2 | 2/2003 | Peters et al. |
| 6,534,192 B1 | 3/2003 | Abys et al. |
| 6,534,863 B2 | 3/2003 | Walker et al. |
| 6,545,563 B1 | 4/2003 | Smith |
| 6,555,782 B2 | 4/2003 | Isaji et al. |
| 6,560,047 B2 | 5/2003 | Choi et al. |
| 6,569,711 B1 | 5/2003 | Susko et al. |
| 6,569,777 B1 | 5/2003 | Hsu et al. |
| 6,572,606 B2 | 6/2003 | Kliewer et al. |
| 6,576,531 B2 | 6/2003 | Peng et al. |
| 6,580,174 B2 | 6/2003 | McCormick et al. |
| 6,582,987 B2 | 6/2003 | Jun et al. |
| 6,582,992 B2 | 6/2003 | Poo et al. |
| 6,593,644 B2 | 7/2003 | Chiu et al. |
| 6,599,436 B1 | 7/2003 | Matzke et al. |
| 6,606,251 B1 | 8/2003 | Kenny, Jr. et al. |
| 6,614,033 B2 | 9/2003 | Suguro et al. |
| 6,620,031 B2 | 9/2003 | Renteln |
| 6,620,731 B1 | 9/2003 | Farnworth et al. |
| 6,621,045 B1 | 9/2003 | Liu et al. |
| 6,638,410 B2 | 10/2003 | Chen et al. |
| 6,653,236 B2 | 11/2003 | Wai et al. |

| Patent | Date | Inventor |
|---|---|---|
| 6,658,818 B2 | 12/2003 | Kurth et al. |
| 6,660,622 B2 | 12/2003 | Chen et al. |
| 6,660,630 B1 | 12/2003 | Chang et al. |
| 6,664,485 B2 | 12/2003 | Bhatt et al. |
| 6,667,551 B2 | 12/2003 | Hanaoka et al. |
| 6,680,459 B2 | 1/2004 | Kanaya et al. |
| 6,699,787 B2 | 3/2004 | Mashino et al. |
| 6,703,310 B2 | 3/2004 | Mashino et al. |
| 6,708,405 B2 | 3/2004 | Hasler et al. |
| 6,746,971 B1 | 6/2004 | Ngo et al. |
| 6,750,144 B2 | 6/2004 | Taylor |
| 6,756,564 B2 | 6/2004 | Tian |
| 6,770,958 B2 | 8/2004 | Wang et al. |
| 6,774,486 B2 | 8/2004 | Kinsman |
| 6,777,244 B2 | 8/2004 | Pepper et al. |
| 6,780,749 B2 | 8/2004 | Masumoto et al. |
| 6,790,775 B2 | 9/2004 | Fartash |
| 6,797,616 B2 | 9/2004 | Kinsman |
| 6,809,025 B2 | 10/2004 | Sandhu et al. |
| 6,809,421 B1 | 10/2004 | Hayasaka et al. |
| 6,818,464 B2 | 11/2004 | Heschel |
| 6,825,127 B2 | 11/2004 | Ouellet et al. |
| 6,825,557 B2 | 11/2004 | DiBattista et al. |
| 6,828,175 B2 | 12/2004 | Wood et al. |
| 6,828,223 B2 | 12/2004 | Chuang |
| 6,838,377 B2 | 1/2005 | Tonami et al. |
| 6,852,621 B2 | 2/2005 | Hanaoka et al. |
| 6,856,023 B2 | 2/2005 | Muta et al. |
| 6,858,891 B2 | 2/2005 | Farnworth et al. |
| 6,864,172 B2 | 3/2005 | Noma et al. |
| 6,864,457 B1 | 3/2005 | Alexander et al. |
| 6,867,390 B2 | 3/2005 | Clauer et al. |
| 6,873,054 B2 | 3/2005 | Miyazawa et al. |
| 6,885,107 B2 | 4/2005 | Kinsman |
| 6,903,012 B2 | 6/2005 | Geefay et al. |
| 6,903,442 B2 | 6/2005 | Wood et al. |
| 6,903,443 B2 | 6/2005 | Farnworth et al. |
| 6,910,268 B2 | 6/2005 | Miller |
| 6,913,952 B2 | 7/2005 | Moxham et al. |
| 6,916,725 B2 | 7/2005 | Yamaguchi |
| 6,936,536 B2 | 8/2005 | Sinha |
| 6,943,056 B2 | 9/2005 | Nemoto et al. |
| 6,946,325 B2 | 9/2005 | Yean et al. |
| 6,951,627 B2 | 10/2005 | Li et al. |
| 6,953,748 B2 | 10/2005 | Yamaguchi et al. |
| 6,962,867 B2 | 11/2005 | Jackson et al. |
| 6,970,775 B2 | 11/2005 | Lederle et al. |
| 6,982,487 B2 | 1/2006 | Kim et al. |
| 7,022,609 B2 | 4/2006 | Yamamoto et al. |
| 7,023,090 B2 | 4/2006 | Huang et al. |
| 7,029,937 B2 | 4/2006 | Miyazawa et al. |
| 7,033,927 B2 | 4/2006 | Cohen et al. |
| 7,037,836 B2 | 5/2006 | Lee et al. |
| 7,041,598 B2 | 5/2006 | Sharma |
| 7,045,015 B2 | 5/2006 | Renn et al. |
| 7,083,425 B2 | 8/2006 | Chong et al. |
| 7,084,073 B2 | 8/2006 | Lee et al. |
| 7,091,124 B2 | 8/2006 | Rigg et al. |
| 7,092,284 B2 | 8/2006 | Braun et al. |
| 7,094,677 B2 | 8/2006 | Yamamoto et al. |
| 7,109,068 B2 | 9/2006 | Akram et al. |
| 7,151,009 B2 | 12/2006 | Kim et al. |
| 7,164,565 B2 | 1/2007 | Takeda |
| 7,166,247 B2 | 1/2007 | Kramer |
| 7,170,183 B1 | 1/2007 | Kim et al. |
| 7,183,176 B2 | 2/2007 | Sankarapillai et al. |
| 7,183,653 B2 | 2/2007 | Myers et al. |
| 7,186,650 B1 | 3/2007 | Dakshina-Murthy |
| 7,190,061 B2 | 3/2007 | Lee et al. |
| 7,199,050 B2 | 4/2007 | Hiatt |
| 7,217,596 B2 | 5/2007 | Cobbley et al. |
| 7,217,888 B2 | 5/2007 | Sunohara et al. |
| 7,232,754 B2 | 6/2007 | Kirby et al. |
| 7,256,073 B2 | 8/2007 | Noma et al. |
| 7,262,134 B2 | 8/2007 | Kirby et al. |
| 7,262,495 B2 | 8/2007 | Chen et al. |
| 7,265,052 B2 | 9/2007 | Sinha |
| 7,271,482 B2 | 9/2007 | Kirby |
| 7,279,776 B2 * | 10/2007 | Morimoto ............... 257/621 |
| 7,300,857 B2 | 11/2007 | Akram et al. |
| 7,317,256 B2 | 1/2008 | Williams et al. |
| 2001/0020739 A1 | 9/2001 | Honda |
| 2002/0005583 A1 | 1/2002 | Harada et al. |
| 2002/0020898 A1 | 2/2002 | Vu et al. |
| 2002/0027293 A1 | 3/2002 | Hoshino |
| 2002/0057468 A1 | 5/2002 | Segawa et al. |
| 2002/0059722 A1 | 5/2002 | Murakami |
| 2002/0060208 A1 | 5/2002 | Liu et al. |
| 2002/0094607 A1 | 7/2002 | Gebauer et al. |
| 2002/0096729 A1 | 7/2002 | Tu et al. |
| 2002/0130390 A1 | 9/2002 | Ker et al. |
| 2002/0190371 A1 | 12/2002 | Mashino et al. |
| 2003/0014895 A1 | 1/2003 | Lizotte |
| 2003/0042564 A1 | 3/2003 | Taniguchi et al. |
| 2003/0119308 A1 | 6/2003 | Geefay et al. |
| 2003/0148597 A1 | 8/2003 | Tan et al. |
| 2003/0216023 A1 | 11/2003 | Wark et al. |
| 2004/0004280 A1 | 1/2004 | Shibata |
| 2004/0018712 A1 | 1/2004 | Plas et al. |
| 2004/0023447 A1 | 2/2004 | Hirakata et al. |
| 2004/0041261 A1 | 3/2004 | Kinsman |
| 2004/0043607 A1 | 3/2004 | Farnworth et al. |
| 2004/0046251 A1 | 3/2004 | Lee |
| 2004/0073607 A1 | 4/2004 | Su et al. |
| 2004/0087441 A1 | 5/2004 | Bock et al. |
| 2004/0094389 A1 | 5/2004 | Boyce |
| 2004/0137661 A1 | 7/2004 | Murayama |
| 2004/0137701 A1 | 7/2004 | Takao |
| 2004/0141536 A1 | 7/2004 | Liu et al. |
| 2004/0159668 A1 | 8/2004 | Vasiadis |
| 2004/0159958 A1 | 8/2004 | Funaki |
| 2004/0178491 A1 | 9/2004 | Akram et al. |
| 2004/0180539 A1 | 9/2004 | Yamamoto et al. |
| 2004/0188260 A1 | 9/2004 | Bonkabeta et al. |
| 2004/0192033 A1 | 9/2004 | Hara |
| 2004/0198033 A1 | 10/2004 | Lee et al. |
| 2004/0198040 A1 | 10/2004 | Geefay et al. |
| 2004/0219342 A1 | 11/2004 | Boggs et al. |
| 2004/0219763 A1 | 11/2004 | Kim et al. |
| 2004/0222082 A1 | 11/2004 | Gopalraja et al. |
| 2004/0245649 A1 | 12/2004 | Imaoka |
| 2004/0255258 A1 | 12/2004 | Li |
| 2004/0262753 A1 | 12/2004 | Kashiwazaki |
| 2005/0026443 A1 | 2/2005 | Goo et al. |
| 2005/0037608 A1 | 2/2005 | Andricacos et al. |
| 2005/0046002 A1 | 3/2005 | Lee et al. |
| 2005/0064707 A1 | 3/2005 | Sinha |
| 2005/0067620 A1 | 3/2005 | Chan et al. |
| 2005/0069782 A1 | 3/2005 | Elenius et al. |
| 2005/0101054 A1 | 5/2005 | Mastromatteo et al. |
| 2005/0101116 A1 | 5/2005 | Tseng |
| 2005/0104228 A1 | 5/2005 | Rigg et al. |
| 2005/0106834 A1 | 5/2005 | Andry et al. |
| 2005/0110095 A1 | 5/2005 | Shih et al. |
| 2005/0110889 A1 | 5/2005 | Tuttle et al. |
| 2005/0127478 A1 | 6/2005 | Hiatt et al. |
| 2005/0136646 A1 | 6/2005 | Larnerd et al. |
| 2005/0139390 A1 | 6/2005 | Kim et al. |
| 2005/0150683 A1 | 7/2005 | Farnworth et al. |
| 2005/0151228 A1 | 7/2005 | Tanida et al. |
| 2005/0164500 A1 | 7/2005 | Lindgren |
| 2005/0184219 A1 | 8/2005 | Kirby |
| 2005/0191861 A1 | 9/2005 | Verhaverbeke |
| 2005/0194169 A1 | 9/2005 | Tonomura |
| 2005/0208766 A1 | 9/2005 | Kirby et al. |
| 2005/0227382 A1 | 10/2005 | Hui |

| | | | | | | |
|---|---|---|---|---|---|---|
| 2005/0231626 A1 | 10/2005 | Tuttle et al. | | 2007/0023121 A1 | 2/2007 | Jones et al. |
| 2005/0236708 A1 | 10/2005 | Farnworth et al. | | 2007/0032061 A1 | 2/2007 | Farnworth et al. |
| 2005/0247894 A1 | 11/2005 | Watkins et al. | | 2007/0035033 A1 | 2/2007 | Ozguz et al. |
| 2005/0253213 A1 | 11/2005 | Jiang et al. | | 2007/0037379 A1 | 2/2007 | Enquist et al. |
| 2005/0254133 A1 | 11/2005 | Akram et al. | | 2007/0042598 A1 | 2/2007 | Park |
| 2005/0258530 A1 | 11/2005 | Vindasius et al. | | 2007/0045120 A1 | 3/2007 | Tiwari et al. |
| 2005/0272221 A1 | 12/2005 | Yen et al. | | 2007/0045388 A1 | 3/2007 | Farnworth et al. |
| 2005/0275048 A1 | 12/2005 | Farnworth et al. | | 2007/0045515 A1 | 3/2007 | Farnworth et al. |
| 2005/0275049 A1 | 12/2005 | Kirby et al. | | 2007/0045632 A1 | 3/2007 | Oliver et al. |
| 2005/0275051 A1 | 12/2005 | Farnworth et al. | | 2007/0045779 A1 | 3/2007 | Hiatt |
| 2005/0275750 A1 | 12/2005 | Akram et al. | | 2007/0045806 A1 | 3/2007 | Hsuan |
| 2005/0277293 A1 | 12/2005 | Kim et al. | | 2007/0045812 A1 | 3/2007 | Heng |
| 2005/0282374 A1 | 12/2005 | Hwang et al. | | 2007/0045826 A1 | 3/2007 | Lee et al. |
| 2005/0285154 A1 | 12/2005 | Akram et al. | | 2007/0045834 A1 | 3/2007 | Chong et al. |
| 2006/0003566 A1 | 1/2006 | Emesh | | 2007/0048896 A1 | 3/2007 | Andry et al. |
| 2006/0011809 A1 | 1/2006 | Farnworth et al. | | 2007/0048994 A1 | 3/2007 | Tuttle |
| 2006/0014313 A1 | 1/2006 | Hall et al. | | 2007/0049016 A1 | 3/2007 | Hiatt et al. |
| 2006/0023107 A1 | 2/2006 | Bolken et al. | | 2007/0049019 A1 | 3/2007 | Wai et al. |
| 2006/0024856 A1 | 2/2006 | Derderian et al. | | 2007/0057028 A1 | 3/2007 | Lake et al. |
| 2006/0035402 A1 | 2/2006 | Street et al. | | 2007/0077753 A1 | 4/2007 | Iwatake et al. |
| 2006/0035415 A1 | 2/2006 | Wood et al. | | 2007/0082427 A1 | 4/2007 | Shirahama et al. |
| 2006/0038183 A1 | 2/2006 | Oliver | | 2007/0096263 A1 | 5/2007 | Furukawa et al. |
| 2006/0038272 A1 | 2/2006 | Edwards | | 2007/0099395 A1 | 5/2007 | Sridhar et al. |
| 2006/0040421 A1 | 2/2006 | Farnworth et al. | | 2007/0111386 A1 | 5/2007 | Kim et al. |
| 2006/0040428 A1 | 2/2006 | Johnson | | 2007/0138562 A1 | 6/2007 | Trezza |
| 2006/0042952 A1 | 3/2006 | Oliver et al. | | 2007/0145563 A1 | 6/2007 | Punzalan et al. |
| 2006/0043262 A1 | 3/2006 | Akram | | 2007/0152342 A1 | 7/2007 | Tsao et al. |
| 2006/0043509 A1 | 3/2006 | Watkins et al. | | 2007/0155997 A1 | 7/2007 | Li et al. |
| 2006/0043512 A1 | 3/2006 | Oliver et al. | | 2007/0158839 A1 | 7/2007 | Trezza |
| 2006/0043569 A1 | 3/2006 | Benson et al. | | 2007/0158853 A1 | 7/2007 | Sinha |
| 2006/0044433 A1 | 3/2006 | Akram | | 2007/0161235 A1 | 7/2007 | Trezza |
| 2006/0046332 A1 | 3/2006 | Derderian et al. | | 2007/0166991 A1 | 7/2007 | Sinha |
| 2006/0046438 A1 | 3/2006 | Kirby | | 2007/0166997 A1 | 7/2007 | Knorr |
| 2006/0046468 A1 | 3/2006 | Akram et al. | | 2007/0167004 A1 | 7/2007 | Trezza |
| 2006/0046471 A1 | 3/2006 | Kirby et al. | | 2007/0170574 A1 | 7/2007 | Lauxtermann et al. |
| 2006/0057776 A1 | 3/2006 | Tao | | 2007/0178694 A1 | 8/2007 | Hiatt |
| 2006/0057836 A1 | 3/2006 | Nagarajan et al. | | 2007/0182020 A1 | 8/2007 | Trezza et al. |
| 2006/0071347 A1 | 4/2006 | Dotta | | 2007/0190803 A1 | 8/2007 | Singh et al. |
| 2006/0148250 A1 | 7/2006 | Kirby | | 2007/0197013 A1 | 8/2007 | Trezza |
| 2006/0151880 A1 | 7/2006 | Tang et al. | | 2007/0202617 A1 | 8/2007 | Hembree |
| 2006/0154153 A1 | 7/2006 | Chiang et al. | | 2007/0222050 A1 | 9/2007 | Lee et al. |
| 2006/0160367 A1 | 7/2006 | Wai et al. | | 2007/0222054 A1 | 9/2007 | Hembree |
| 2006/0177959 A1 | 8/2006 | Boettiger et al. | | 2007/0228576 A1 | 10/2007 | Trezza |
| 2006/0177999 A1 | 8/2006 | Hembree et al. | | 2007/0228926 A1 | 10/2007 | Teo et al. |
| 2006/0180941 A1 | 8/2006 | Kirby et al. | | 2007/0262424 A1 | 11/2007 | Hiatt |
| 2006/0186097 A1 | 8/2006 | Watkins et al. | | 2007/0267138 A1 | 11/2007 | White et al. |
| 2006/0186492 A1 | 8/2006 | Boettiger et al. | | 2007/0281473 A1 | 12/2007 | Clark et al. |
| 2006/0191882 A1 | 8/2006 | Watkins et al. | | 2007/0293040 A1 | 12/2007 | Emesh et al. |
| 2006/0199363 A1 | 9/2006 | Kirby et al. | | 2008/0006850 A1 | 1/2008 | Ribnicek et al. |
| 2006/0204651 A1 | 9/2006 | Wai et al. | | 2008/0050904 A1 | 2/2008 | Lake |
| 2006/0208360 A1 | 9/2006 | Yiu et al. | | 2008/0050911 A1 | 2/2008 | Borthakur |
| 2006/0216862 A1 | 9/2006 | Rigg et al. | | 2008/0054444 A1 | 3/2008 | Tuttle |
| 2006/0223301 A1 | 10/2006 | Vanhaelemeersch et al. | | 2008/0057620 A1 | 3/2008 | Pratt |
| 2006/0249849 A1 | 11/2006 | Cohen | | 2008/0079120 A1 | 4/2008 | Foster et al. |
| 2006/0252254 A1 | 11/2006 | Basol | | 2008/0079121 A1 | 4/2008 | Han |
| 2006/0252262 A1 | 11/2006 | Kazemi | | 2008/0081386 A1 | 4/2008 | Raravikar et al. |
| 2006/0255443 A1 | 11/2006 | Hwang et al. | | 2008/0081398 A1 | 4/2008 | Lee et al. |
| 2006/0264041 A1 | 11/2006 | Rigg et al. | | 2008/0265933 A1 | 10/2008 | Tanioka et al. |
| 2006/0270108 A1 | 11/2006 | Farnworth et al. | | 2009/0007934 A1 | 1/2009 | Hutto |
| 2006/0278979 A1 | 12/2006 | Rangel | | 2009/0014859 A1 | 1/2009 | Jeung et al. |
| 2006/0278980 A1 | 12/2006 | Trezza et al. | | 2009/0057912 A1 | 3/2009 | Kheng |
| 2006/0278988 A1 | 12/2006 | Trezza et al. | | | | |
| 2006/0278989 A1 | 12/2006 | Trezza | | | | |
| 2006/0281224 A1 | 12/2006 | Edelstein et al. | | | | |
| 2006/0281243 A1 | 12/2006 | Trezza | | EP | 0127946 A1 | 12/1984 |
| 2006/0289967 A1 | 12/2006 | Heck et al. | | EP | 1415950 A2 | 5/2004 |
| 2006/0289968 A1 | 12/2006 | Sulfridge | | JP | 63052432 A | 3/1988 |
| 2006/0290001 A1 | 12/2006 | Sulfridge | | JP | 02235589 A | 9/1990 |
| 2006/0292877 A1 | 12/2006 | Lake | | JP | 2001077496 A | 3/2001 |
| 2007/0004079 A1 | 1/2007 | Geefay et al. | | JP | 2001298147 A | 10/2001 |
| 2007/0012655 A1 | 1/2007 | Kwon et al. | | JP | 2002018585 A | 1/2002 |
| 2007/0020805 A1 | 1/2007 | Kim et al. | | JP | 2005093980 A | 4/2005 |
| 2007/0020935 A1 | 1/2007 | Taylor et al. | | JP | 2005310817 A | 11/2005 |

FOREIGN PATENT DOCUMENTS

| | | | |
|---|---|---|---|
| KR | 20010018694 A | 3/2001 | |
| KR | 20020022122 A | 3/2002 | |
| KR | 20020061812 A | 7/2002 | |
| TW | 250597 B | 3/2006 | |
| WO | 2004109770 A2 | 12/2004 | |
| WO | 2005022965 A2 | 3/2005 | |
| WO | 2005036940 A1 | 4/2005 | |
| WO | 2006053036 A2 | 5/2006 | |
| WO | 2006124597 A2 | 11/2006 | |
| WO | 2007025812 A1 | 3/2007 | |
| WO | 2007043718 A1 | 4/2007 | |

OTHER PUBLICATIONS

Aachboun, S. and P. Ranson, "Deep anisotropic etching of silicon," J. Vac. Sci. Technol. A 17(4), Jul./Aug. 1999, pp. 2270-2273.

Amazawa, T. et al., "Planarized Multilevel Interconnection Using Chemical Mechanical Polishing of Selective CVD-Al Via Plugs," IEEE Transactions on Electron Devices, vol. 45, No. 4, pp. 815-820, Apr. 1998.

Armacost, M. et al., "Plasma-Etching Processes for ULSI Semiconductor Circuits," IBM J. Res. Develop., vol. 43, No. 1/2, pp. 39-72, Jan./Mar. 1999, <http://www.research.ibm.com/journal/rd/431/armacost.pdf>.

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007—Jun. 1, 2007, pp. 1179-1185.

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Blackburn, J.M. et al., "Deposition of Conformal Copper and Nickel Films from Supercritical Carbon Dioxide," Science, vol. 94, Oct. 2001, pp. 141-145.

Cheung, T.S.D. et al., "On-Chip Interconnect for mm-Wave Applications Using an All-Copper Technology and Wavelength Reduction," 2003 IEEE International Solid-State Circuits Conference.

Chou, Bill et al., "Ultra Via Substrate for Advanced BGA Applications," Pan Pacific Symposium, Jan. 25, 2000, <http://www.smta.org/files/PanPac00-ChouBill.pdf>.

De Boer, M.J. et al., "Micromachining of Buried Micro Channels in Silicon," Journal of Microelectromechanical Systems, vol. 9, No. 1, Mar. 2000, IEEE, ISSN: 1057-7157.

Gutmann, R.J., "Wafer-Level Three-Dimensional Monolithic Integration for Heterogeneous Silicon ICs," 2004 Topical Meeting on Silicon Monolithic Integrated Circuits in RF Systems, IEEE, Sep. 8-10, 2004, pp. 45-48.

Hirafune, S. et al., "Packaging Technology for Imager Using Through-hole Interconnection in Si Substrate," Proceeding of HDP'04, IEEE, pp. 303-306, Jul. 2004.

Jang, D.M. et al., "Development and Evaluation of 3-D SiP with Vertically Interconnected Through Silicon Vias (TSV)," Proceedings of the 57th Electronic Components and Technology Conference, IEEE, May 29, 2007-Jun. 1, 2007, pp. 847-852, ISBN: 1-4244-0985-3.

Kada, M. et al., "Advancements in Stacked Chip Scale Packaging (S-CSP) Provides System-in-a-Package Functionality for Wireless and Handheld Applications," Future Fab Intl., vol. 9, Jan. 7, 2000.

Keigler, A. et al., "Enabling 3-D Design," Semiconductor International, Aug. 2007.

Kim, J.Y. et al., "S-RCAT (Sphere-shaped-Recess-Channel-Array Transistor) Technology for 70nm DRAM Feature Size and Beyond," 2005 Symposium on VLSI Technology, Digest of Technical Papers, Jun. 14-16, 2005, pp. 34-35, IEEE, ISBN: 4-900784-02-8.

Kuhn, Markus and Jose A. Rodriguez, "Adsorption of sulfur on bimetallic surfaces: Formation of copper sulfides on Pt (111) and Ru(001)," J. Vac. Sci. Technol. A 13(3), pp. 1569-1573, May/Jun. 1995.

Kurita, Y. et al., "A 3D Stacked Memory Integrated on a Logic Device Using SMAFTI Technology," 2007 IEEE Electronic Components and Technology Conference, pp. 821-829, May 29-Jun. 1, 2007, ISBN 1-4244-0985-3.

Kyocera Corporation, Memory Package, 1 page, retrieved from the Internet on Dec. 3, 2004, <http://global.kyocera.com/prdct/semicon/ic_pkg/memory_p.html>.

Lee, H.M. et al., Abstract of "Abatement of Sulfur Hexaflouride Emissions from the Semiconductor Manufacturing Process by Atmospheric-Pressure Plasmas," 1 page, Aug. 2004, <http:www.awma.org/journal/ShowAbstract.asp?Year=&PaperID=1256>.

Lee, R.A. et al., "Laser Created Silicon Vias for Stacking Dies in MCMs," IEEE/CHMT IEMT Symposium, 1991, pp. 262-265.

Lee, T.K. et al., "A Novel Joint-in-Via Flip-Chip Chip-Scale Package," IEEE Transactions on Advanced Packaging, vol. 29, No. 1, pp. 186-194, Feb. 2006.

Moffat, T.P., et al. "Superconformal film growth; Mechanism and quantification," IBM J. Res. & Dev., vol. 49, No. 1, pp. 19-36, Jan. 2005.

Morrow, P.R. et al., "Three-Dimensional Wafer Stacking Via Cu-Cu Bonding Integrated With 65-nm Strained-Si/Low-k CMOS Technology," IEEE Electron Device Letters, vol. 27, No. 5, pp. 335-337, May 2006, ISBN: 0741-3106.

Pienimaa, S.K. et al., "Stacked Thin Dice Package," Proceedings of the 51st Electronic Components and Technology Conference, 2001, pp. 361-366, IEEE.

Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003.

Savastiouk, S. et al., "Thru-silicon interconnect technology," 26th IEEE/CPMT International Electronics Manufacturing Technology Symposium, 2000, abstract.

Schaper, L. et al., "Integrated System Development for 3-D VLSI," Electronic Components and Technology Conference, 2007, ECTC '07, Proceedings, 57th, May 29-Jun. 1, 2007, pp. 853-857.

Solberg, V., "Innovative 3-D Solutions for Multiple Die Packaging," SMTA International Conference, Sep. 21, 2003.

Takahashi, K. et al., "Current Status of Research and Development for Three-Dimensional Chip Stack Technology," Jpn. J. Appl. Phys., vol. 40 (2001), pp. 3032-3037, Part 1, No. 4B, Apr. 30, 2001, abstract.

Takahashi, K. et al., "Through Silicon Via and 3-D Wafer/Chip Stacking Technology," 2006 Symposium on VLSI Circuits, Digest of Technical Papers, pp. 89-92, IEEE, ISBN: 1-4244-006-6.

Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.

Tezcan, D.S. et al., "Sloped Through Wafer Vias for 3D Wafer Level Packaging," Electronic Components and Technology Conference, 2007, ECTC '07, Proceedings, 57th, May 29-Jun. 1, 2007, pp. 643-647.

Thomas, D.J. et al., "Etching of Vias and Trenches Through Low k Dielectrics with Feature Sizes Down to 0.1 mm Using M0RIO High Density Plasmas," presented at the 197th Meeting of The Electrochemical Society, Toronto 2000, <http://www.trikon.com/pdfs/ECS2b.pdf>.

Trigas, C., "System-In-Package or System-On-Chip?," EE Times, Sep. 19, 2003, <http://www.eetimes.com/story/OEG20030919S0049>.

Vereecken, P.M. et al., "The chemistry of additives in damascene copper plating," IBM J. Res. & Dev., vol. 49, No. 1, pp. 3-18, Jan. 2005.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

XSiL, xise200 for vias and micro-machining, <http://www.xsil.com/products/index/html>, retrieved from the Internet on Aug. 16, 2003.

Yamamoto, S. et al., "Si Through-Hole Interconnections Filled with Au-Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-7744-3.

* cited by examiner

MICROELECTRONIC WORKPIECES AND METHODS AND SYSTEMS FOR FORMING INTERCONNECTS IN MICROELECTRONIC WORKPIECES

CROSS-REFERENCE TO APPLICATION INCORPORATED BY REFERENCE

The subject matter of U.S. patent application Ser. No. 11/056,211 is related to the subject matter of the present application, and is incorporated into the present application in its entirety by reference.

TECHNICAL FIELD

The following disclosure relates generally to microelectronic workpieces and, more particularly, to methods and systems for forming interconnects through such workpieces.

BACKGROUND

Microelectronic devices, micromechanical devices, and other types of devices with microfeatures are typically formed by constructing several layers of components on a workpiece. Microelectronic devices, for example, are typically formed by fabricating a plurality of dies on a single workpiece. Each die can include a plurality of bond-pads coupled to an integrated circuit. The dies are separated from each other after fabrication and packaged to form individual microelectronic devices that can be attached to modules or installed in other electronic products.

The dies described above typically include conductive interconnects to electrically couple components located in different layers of the die. In some applications, it may be desirable to form interconnects that extend completely through the die or through a significant portion of the die. Such interconnects can be used to electrically couple bond-pads or other conductive elements on one side of the die to conductive elements on the other side of the die. Through-wafer interconnects, for example, are constructed by forming deep vias on the front side and/or backside of the wafer in alignment with bond-pads on the front side of the wafer. The vias are often "blind" vias in that they are closed at one end. The blind vias are then filled with a conductive material. After further processing, the wafer is thinned to reduce the final die thickness. Solder balls or other external electrical contacts can be attached to the through-wafer interconnects at the backside and/or the front side of the wafer to facilitate subsequent packaging. The solder balls and other external contacts can be attached either before or after singulating the dies from the wafer.

One shortcoming of prior art methods for forming through-wafer interconnects is that it is often difficult to fill deep, narrow blind vias with electrically conductive material. In most processes using solder, for example, an oxide reducing agent or flux is used on a layer of nickel within the blind via to remove oxides from the nickel and to prevent the nickel and other materials in the via (e.g., solder) from forming oxides. When the molten solder enters the blind via, the oxide reducing agent produces gases that can be trapped in the closed end of the blind via. These gases can produce undesirable voids or other discontinuities in the interconnect. In addition, the oxide reducing agent itself may be trapped in the fill material and cause additional voids or irregular regions within the interconnect.

Another shortcoming of prior art methods for forming through-wafer interconnects is that vapor deposition processes may produce non-uniform seed layers on the sidewalls of the vias. This can affect subsequent plating processes in high aspect ratio holes because the nonuniform seed layers cause the plating rate to be higher at the openings than deep within the vias. The electroplating processes, for example, may "pinch-off" the openings of high aspect ratio holes before the holes are filled completely. In view of these shortcomings with prior art methods, there is a need to more effectively form interconnects in blind vias and other deep holes in microfeature workpieces.

DETAILED DESCRIPTION

A. Overview

Figure 1A:
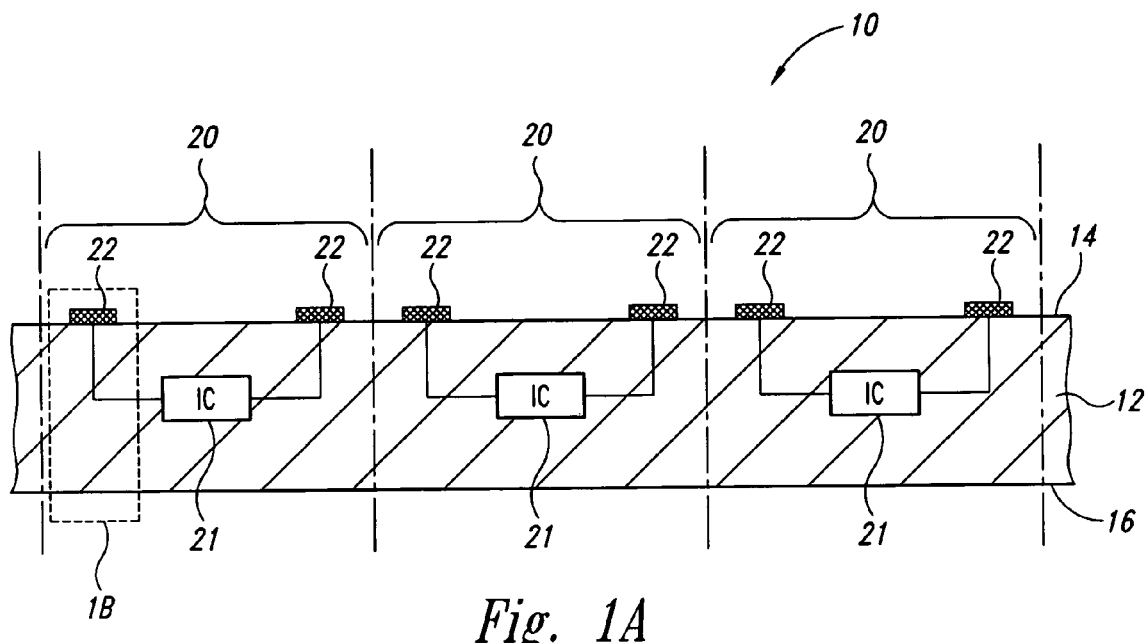
FIGS. 1A-1H are a series of side cross-sectional views illustrating various stages in a method of forming an interconnect through a workpiece in accordance with an embodiment of the invention.

The following disclosure describes several embodiments of microelectronic workpieces and methods and systems for forming interconnects in such workpieces. A method of manufacturing a microelectronic workpiece in accordance with one aspect of the invention includes forming a blind hole in the workpiece that extends from an exterior surface of the workpiece to an intermediate depth in the workpiece. The method further includes forming a vent in the workpiece in fluid communication with the blind hole, and moving electrically conductive material into at least a portion of the blind hole by drawing at least a partial vacuum in the vent. In one embodiment, the blind hole can be formed in a first exterior surface of the workpiece, and forming a vent in the workpiece can include laser-cutting or etching a hole that extends from a second exterior surface of the workpiece to the blind hole. In another embodiment, drawing at least a partial vacuum in the vent can include at least partially evacuating a chamber, tube, etc. removably positioned in fluid communication with an opening of the vent.

A method of manufacturing a microelectronic workpiece in accordance with another aspect of the invention includes electrically coupling a terminal on an exterior surface of the workpiece to an integrated circuit in the workpiece. The method further includes forming a blind hole in the workpiece that extends through the terminal, and forming a vent in the workpiece in fluid communication with the blind hole. The method additionally includes at least partially filling the blind hole with electrically conductive material by moving the electrically conductive material into the vent and then into the blind hole. In one embodiment, the blind hole is formed on a first exterior surface of the workpiece, and the method further includes removing material from a second exterior surface of the workpiece to thin the workpiece after moving the electrically conductive material into the blind hole.

An assembly for manufacturing an electrical interconnect in accordance with a further aspect of the invention includes a microelectronic workpiece, a flowable, electrically conductive material, and a vacuum fixture. The microelectronic workpiece has a passage extending from a first opening in a first side of the workpiece to a second opening in a second side of the workpiece. To fill the passage, the flowable, electrically conductive material is positioned in fluid communication with the first opening in the workpiece, and an interior volume of the vacuum fixture is positioned in fluid communication with the second opening in the workpiece. The interior volume is then evacuated to move the flowable, electrically conductive material at least partially into the passage through the first opening. In one embodiment, the vacuum fixture can include a base portion having a seal that extends around the second opening in the workpiece to seal the interior volume during evacuation.

An apparatus for forming an electrical interconnect in a microelectronic workpiece in accordance with yet another aspect of the invention includes an evacuating device operably coupled to a body. The body can include an interior wall portion at least partially defining an interior volume in fluid communication with the evacuating device. The body can further include a sealable base portion extending at least partially around the interior volume. In operation, the sealable base portion of the body is positioned around a first opening of a passage that extends through the microelectronic workpiece, and the interior volume is at least partially evacuated by the evacuating device to draw a flowable material into the passage through a second opening. In one embodiment, the body of the apparatus can further include vented support members that restrain the workpiece from flexing under the pressure differential caused by the vacuum.

Specific details of several embodiments of the invention are described below with reference to interconnects that extend through a terminal on one side of a microelectronic workpiece. The workpieces, for example, illustrate dies having integral circuitry, but the dies can include image sensors. The microelectronic devices can accordingly be memory devices (e.g., DRAM, flash, etc.), imagers (e.g., CMOS, CCD, etc.), processors, and other devices. The invention, however, is not limited to these particular embodiments and, accordingly, extends to other types of interconnects in other types of workpieces. Furthermore, while many details of several embodiments of the invention are described below, other details describing well-known structures and/or processes often associated with fabricating microelectronic devices are not set forth below to avoid obscuring the described embodiments. A person of ordinary skill in the art will understand, however, that the invention may have other embodiments that lack several of the features shown in FIGS. 1A-7 or include other elements in addition to those shown in FIGS. 1A-7.

B. Methods of Forming Interconnects in Microelectronic Workpieces

FIGS. 1A-1H illustrate various stages of a method for forming interconnects in a workpiece 10 in accordance with an embodiment of the invention. FIG. 1A illustrates the workpiece 10 at an initial stage before the interconnects have been formed. The workpiece 10 can include a substrate 12 having a first side 14 and a second side 16. The workpiece 10 can also include a plurality of microelectronic dies 20 on and/or in the substrate 12. Each microelectronic die 20 can include integrated circuitry 21 and a plurality of terminals 22 (e.g., bondpads) operatively coupled to the integrated circuitry 21. The dies 20 can also include microlenses and an array of image sensors. The terminals 22 shown in FIG. 1A are external features at the first side 14 of the substrate 12. In other embodiments, however, the terminals 22 can be internal features that are embedded at an intermediate depth within the substrate 12.

Figure 1B:
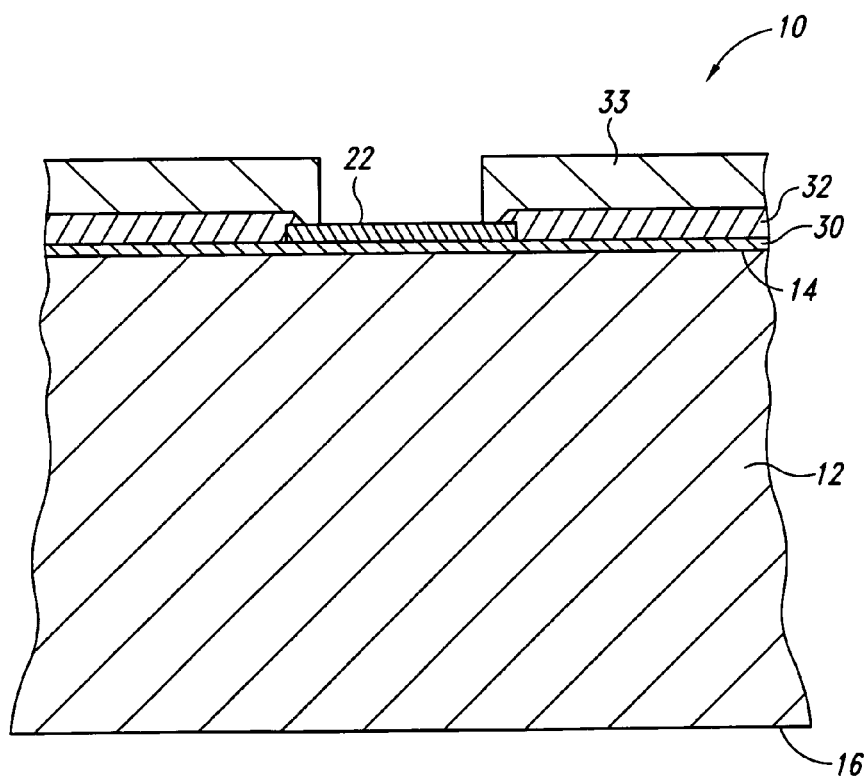

FIG. 1B is an enlarged, side cross-sectional view of the area 1B shown in FIG. 1A. In previous processing steps, a first dielectric layer 30 was applied to the first side 14 of the substrate 12, and a second dielectric layer 32 was applied over the first dielectric layer 30. The second dielectric layer 32 was then patterned and etched to expose the terminal 22. The dielectric layers 30 and 32 can include polyimide materials and/or other suitable nonconductive materials known in the art. For example, the first dielectric layer 30 and/or one or more of the subsequent dielectric layers can be parylene, a low temperature chemical vapor deposition (low temperature CVD) material such as tetraethylorthosilicate (TEOS), silicon nitride ($Si_3N_4$), and silicon oxide ($SiO_2$), and/or other suitable materials. The foregoing list of dielectric materials is not exhaustive. The dielectric layers 30 and 32 are not generally composed of the same material as each other, but these layers may be composed of the same material. In addition, one or both of the layers 30 and 32 may be omitted and/or additional layers may be included, such as in the case of a redistribution layer. After depositing the second dielectric layer 32, a mask 33 is applied over the second dielectric layer 32 and patterned as shown in FIG. 1B. The mask 33 can be a layer of resist that is patterned according to the arrangement of terminals 22 on the substrate 12. As such, the mask 33 has an opening over the terminal 22.

Figure 1C:
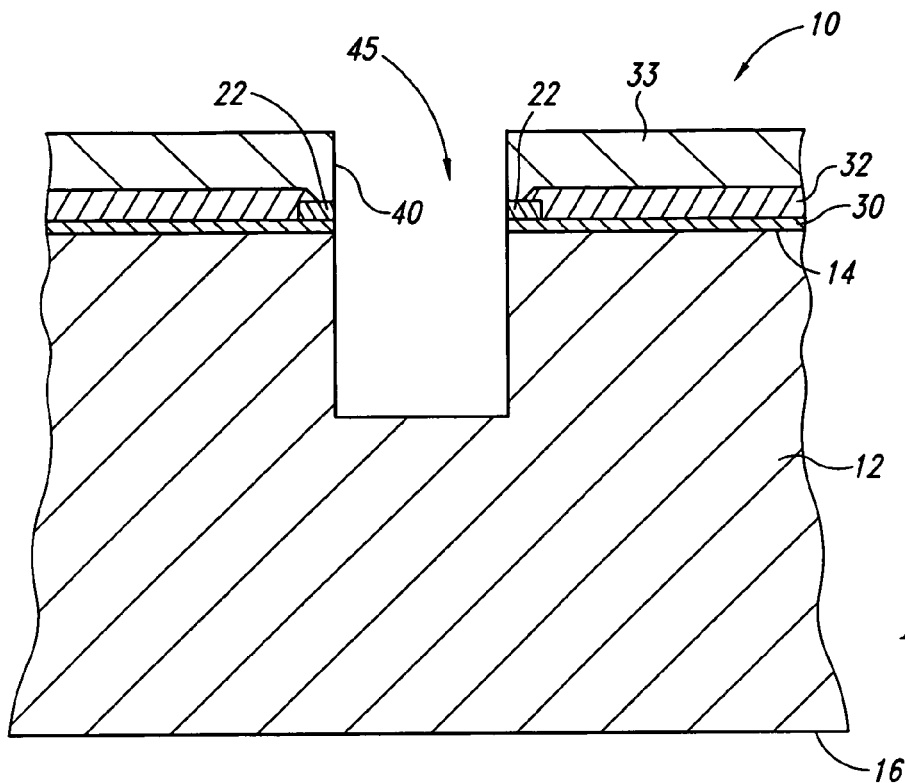

Referring to FIG. 1C, a hole or aperture 40 is formed through at least part of the substrate 12. The hole 40 extends through the terminal 22, the first dielectric layer 30, and a portion of the substrate 12 to define a blind hole or via 45. For purposes of this specification, a "blind hole" or "blind via" refers to a hole or aperture that extends only partially through the substrate 12 or is otherwise closed at one end. In one embodiment, the hole 40 can be formed by etching through the materials using one or more etches. After forming the hole 40, the mask 33 is removed from the workpiece 10.

The hole 40 can alternatively be formed using a laser in addition to or in lieu of etching. If a laser is used to form all or a portion of the hole 40, it is typically cleaned using chemical cleaning agents to remove slag or other contaminants. Although laser cutting the hole 40 may be advantageous because the substrate 12 does not need to be patterned (i.e., mask 33 would not need to be applied), etching the hole 40 may be easier because the slag does not need to be cleaned from the hole 40 and the depth of the hole 40 can be more precisely controlled with an etching process. A further advantage of using an etching process is that the first side 14 of the substrate 12 can be patterned and etched to simultaneously form a plurality of holes 40 aligned with corresponding terminals 22. Furthermore, the holes 40 can generally be more precisely aligned using an etching process as compared with a laser cutting process.

Figure 1D:
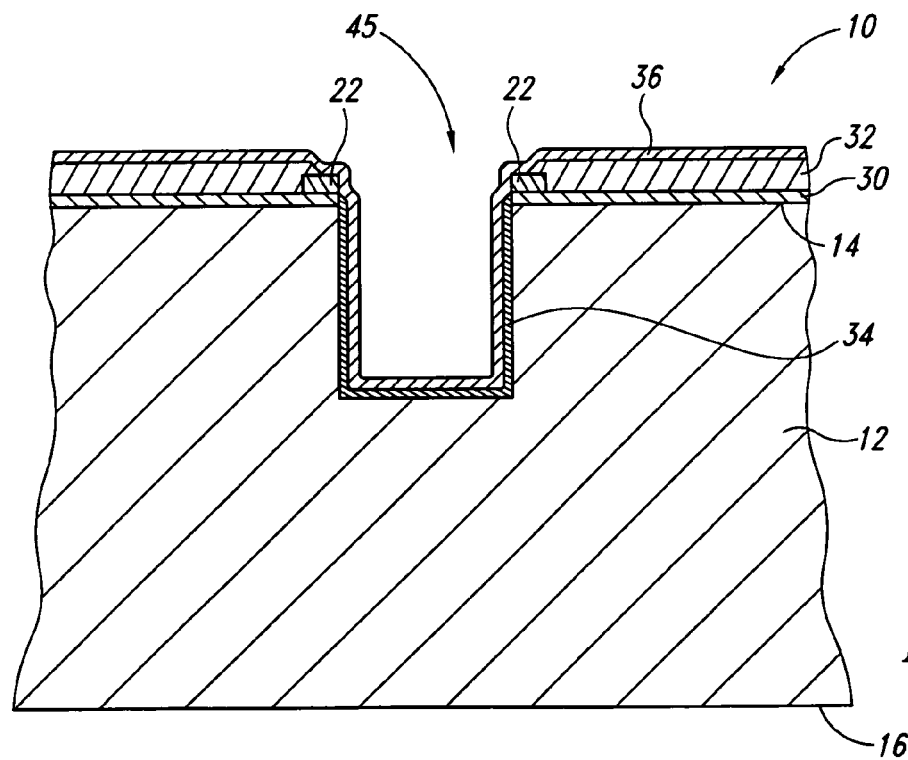

Referring next to FIG. 1D, a third dielectric layer 34 is deposited onto the workpiece 10 to line the sidewalls of the hole 40 within the substrate 12. The third dielectric layer 34 electrically insulates components in the substrate 12 from an interconnect that is subsequently formed in the hole 40, as described in greater detail below. In one embodiment, the third dielectric layer 34 can be a low temperature CVD oxide, but in other embodiments the third dielectric layer 34 can be other suitable dielectric materials. A suitable etching process is then used to remove the third dielectric layer 34 from at least a portion of the terminal 22. A barrier layer 36 is then deposited onto the workpiece 10 over the third dielectric layer 34 and in electrical contact with the terminal 22. In practice, the barrier layer 36 generally covers the second dielectric layer 32 and the terminal 22 in addition to the third dielectric layer 34. The barrier layer 36 can be deposited onto the workpiece 10 using a vapor deposition process, such as CVD or physical vapor deposition (PVD). The barrier layer 36 can be composed of Ta, W, or other suitable materials.

Figure 1E:
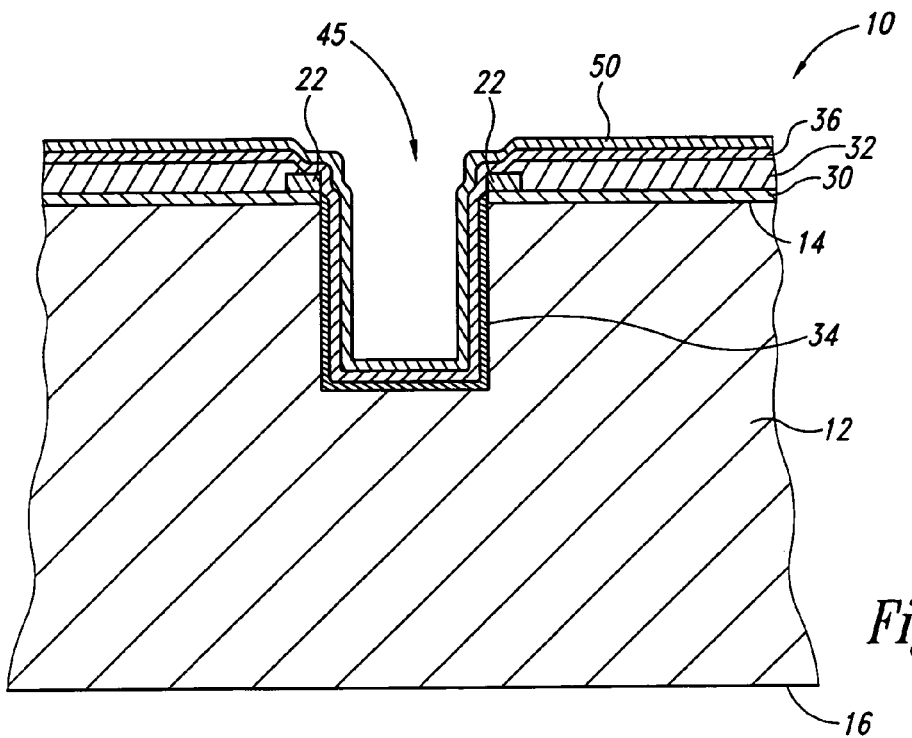

Referring next to FIG. 1E, a seed layer 50 is deposited onto the barrier layer 36. The seed layer 50 can be deposited using vapor deposition techniques, such as CVD, PVD, atomic layer deposition, and/or plating. The seed layer 50 can be composed of Cu or other suitable materials. The thickness of the seed layer 50 is generally 400 Angstroms to 2 microns. The seed layer 50, however, may not cover the barrier layer 36 uniformly. This may cause subsequent electroplating processes to not apply a uniform metal layer onto the workpiece. If the seed layer is deficient, it can be enhanced using an enhancement process that fills voids or noncontinuous regions of the seed layer 50 to form a more uniform seed layer. One suitable seed layer enhancement process is described in U.S. Pat. No. 6,197,181, which is incorporated by reference.

Figure 1F:
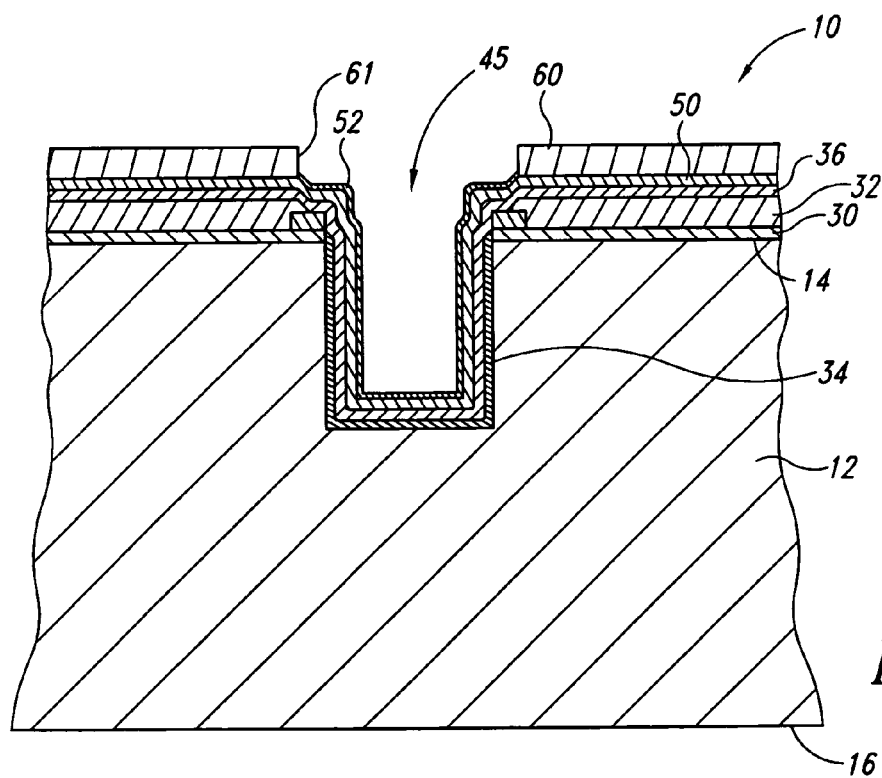

Referring next to FIG. 1F, a resist layer 60 is deposited onto the seed layer 50, and the resist layer 60 is patterned to have an opening 61 over the terminal 22 and corresponding blind hole 45. In several embodiments, a first conductive layer 52 can then be deposited onto the exposed portions of the seed layer 50 in the blind hole 45. The first conductive layer 52 can be Cu that is deposited onto the seed layer 50 in an electroless plating operation, electroplating operation, or another suitable method. The application of the first conductive layer 52 is an optional step that can be omitted in several embodiments.

Figure 1G:
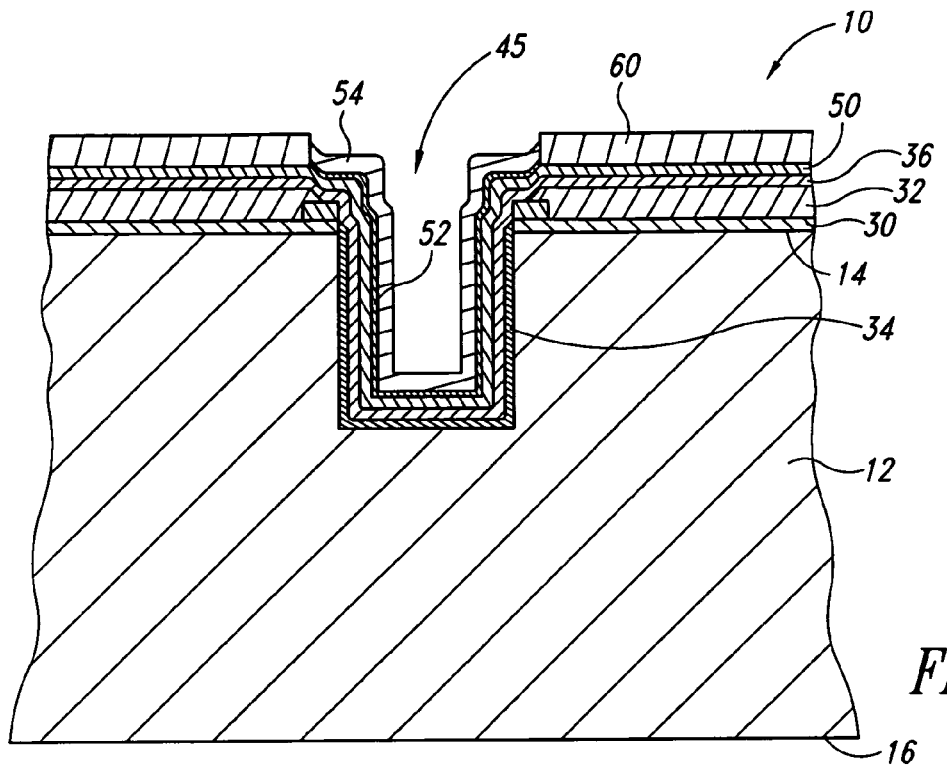

Referring to FIG. 1G, a second conductive layer 54 is deposited onto the first conductive layer 52 in the blind hole 45. The second conductive layer 54 is a wetting agent that facilitates depositing subsequent materials into the blind hole 45. The second conductive layer 54 can be Ni that is deposited onto the first conductive layer 52 using an electroless or electrolytic plating process. In other embodiments, the blind hole 45 may be coated with other suitable materials using other methods.

Figure 1H:
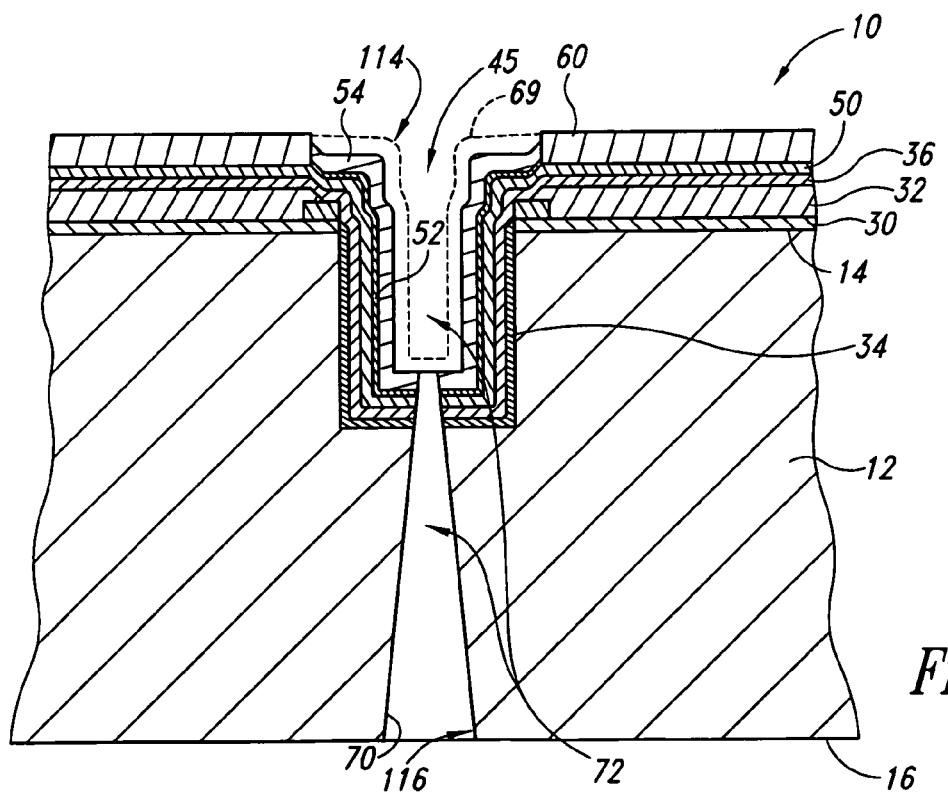

Referring next to FIG. 1H, a vent hole 70 is formed in the substrate 12 from the second side 16 to a bottom portion of the blind hole 45. The vent hole 70 and the blind hole 45 together form a through-hole or passage 72 that extends through the substrate from a first opening 114 to a second opening 116. The vent hole 70 can be formed using a laser to cut through the substrate 12 from the second side 16 to the bottom of the blind hole 45. The laser can be aligned with the blind hole 45 and/or corresponding terminal 22 using scanning/alignment systems known in the art. A suitable laser is the Xise200 model, which is commercially available from Xsil Ltd. of Dublin, Ireland.

After forming the vent hole 70, it can be cleaned to remove ablated byproducts (i.e., slag) and/or other undesirable byproducts resulting from the laser. For example, the vent hole 70 can be cleaned using a suitable cleaning agent, such as 6% tetramethylammonium hydroxide (TMAH): propylene glycol. In other embodiments, the vent hole 70 may be left unclean. In alternative embodiments, the vent hole 70 can be a different size or shape, and may be formed using an etching process (e.g., a dry etch and/or a wet etch), a mechanical drilling process, a dicing or laser slot, or another suitable method known in the art.

In several embodiments, a temporary protective filling or coating 69 (shown in broken lines) can be deposited into the blind hole 45 before forming the vent hole 70. The protective filling 69 can be a photoresist, polymer, water, solidified liquid or gas, and/or other suitable materials known in the art. The protective filling 69 protects the sidewalls of the blind hole 45 from slag produced during the laser drilling process. The slag can adversely affect the plating of nickel onto the seed layer and/or the wetting of a conductive fill material into the blind hole 45. The protective filling 69 can be removed after forming the vent hole 70.

Figure 2A:
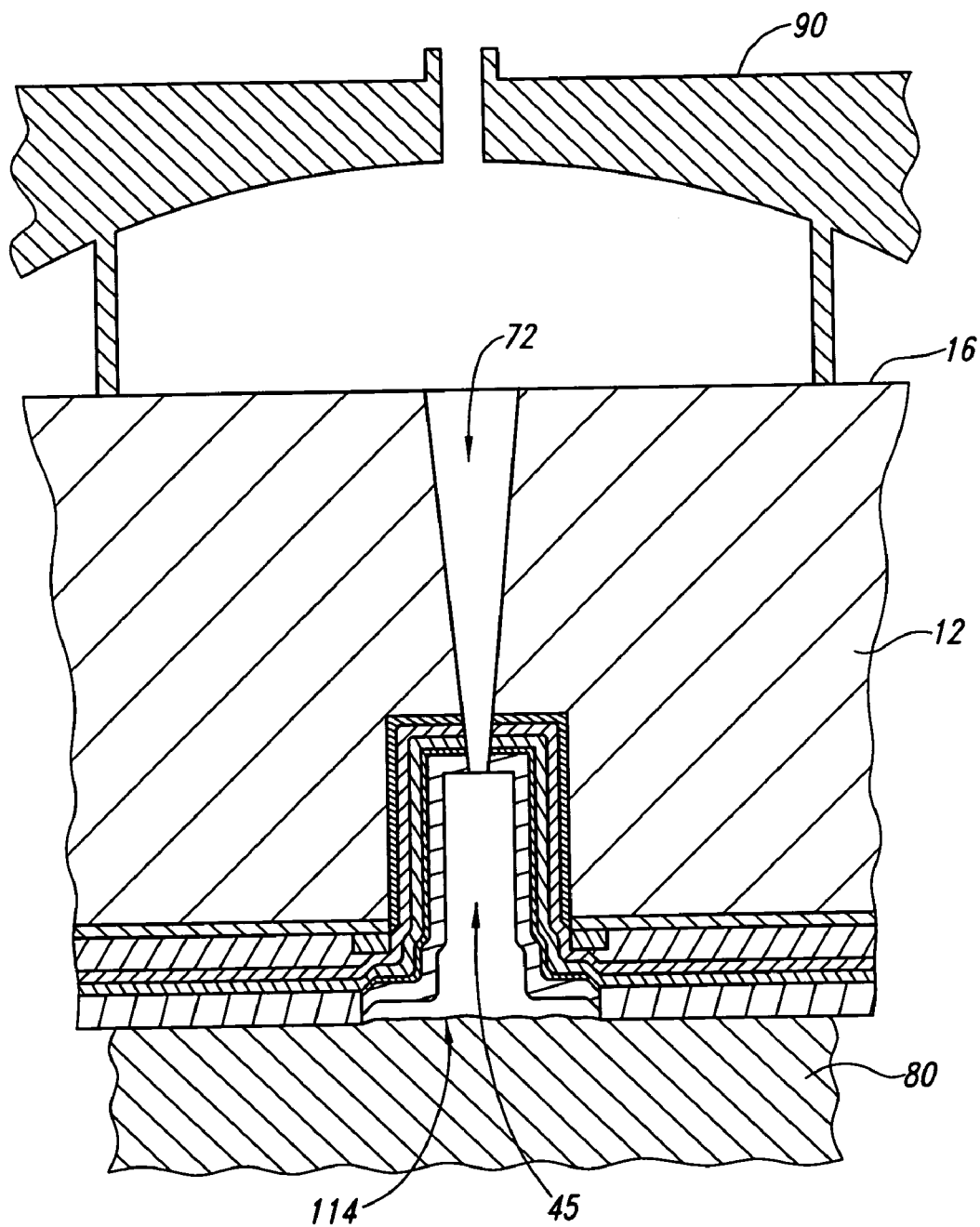
FIGS. 2A-2B are side cross-sectional views illustrating additional stages in a method of forming an interconnect through a workpiece in accordance with an embodiment of the invention.
Figure 2B:
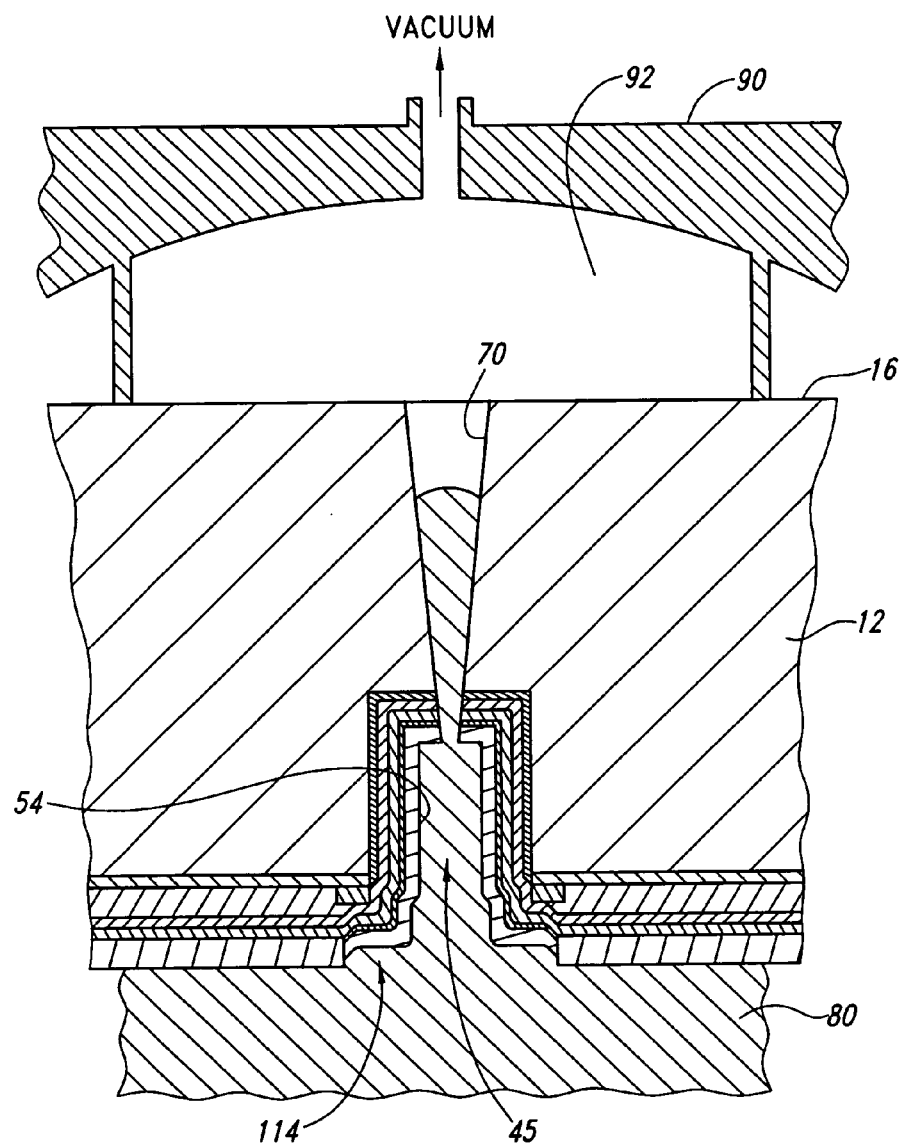

FIGS. 2A and 2B are side cross-sectional views illustrating two stages in a method of filling the blind hole 45 with a conductive fill material 80 in accordance with an embodiment of the invention. In this embodiment, the substrate 12 is inverted relative to its orientation in FIGS. 1A-1H discussed above. Referring first to FIG. 2A, a vacuum fixture 90 is sealably positioned against the second side 16 of the substrate 12. The fill material 80 is positioned in flowable form (e.g., molten form) at the first opening 114 of the blind hole 45. The fill material 80 can include flowable CU, Ni, Co, Ag, Au, solder, and/or other conductive materials known in the art. The fill material 80 can be positioned at the first opening 114 using various techniques known in the art, including, for example, wave techniques, fountain techniques, pooling techniques, etc.

Referring next to FIG. 2B, the fill material 80 is moved into the blind hole 45 by at least partially evacuating an interior volume 92 of the vacuum fixture 90. Evacuating the interior volume 92 in this manner can facilitate movement of the fill material 80 into the blind hole 45 by at least one of (a) creating a pressure differential that draws or sucks the fill material 80 into the blind hole 45 through the first opening 114, and/or (b) removing undesirable gasses that may be trapped in the blind hole 45 to facilitate wetting of the blind hole with the fill material 80. The second conductive layer 54 can serve as a wetting agent that facilitates the flow of the fill material 80 into the blind hole 45. Conversely, the lack of the second conductive layer 54 on the sidewalls of the vent hole 70 can advantageously inhibit the flow of fill material 80 into the vent hole 70 when drawn by the vacuum. In addition, as the fill material 80 flows into the vent 70, it cools and hardens, further slowing the flow. In one embodiment, the substrate 12 can be cooled proximate to the second surface 16 to accelerate hardening of the fill material 80 as or before it reaches the second surface 16.

Various types of solutions and other materials can be drawn into the blind hole 45 before the conductive fill material 80 to facilitate filling of the blind hole 45 with the fill material 80 and/or adherence of the fill material 80 to the sidewalls of the blind hole 45. These materials can include cleaning solutions, fluxes, and/or other known surface treatments. In one embodiment, for example, an oxide reducing agent (not shown) can be drawn, wetted, or otherwise moved into the blind hole 45 before the conductive fill material 80 to facilitate filling of the blind hole 45 with the fill material 80. The layer of oxide reducing agent can remove oxides from the second conductive layer 54 (e.g., a Ni layer) and can prevent the second conductive layer 54 and other materials in the blind hole 45 (e.g., solder) from forming oxides. In addition, applying a layer of oxide reducing agent to the blind hole 45 can enhance the ability of the fill material 80 to adhere to the sidewalls of the hole. In one embodiment, the oxide reducing agent material can be drawn into the blind hole 45 using the vacuum process described above for the conductive fill material 80. It may be advantageous, however, to elevate the temperature of the substrate 12 after introduction of the oxide reducing agent to bake out volatiles and/or moisture in the oxide reducing agent before introducing the conductive fill material into the blind hole 45.

Figure 3A:
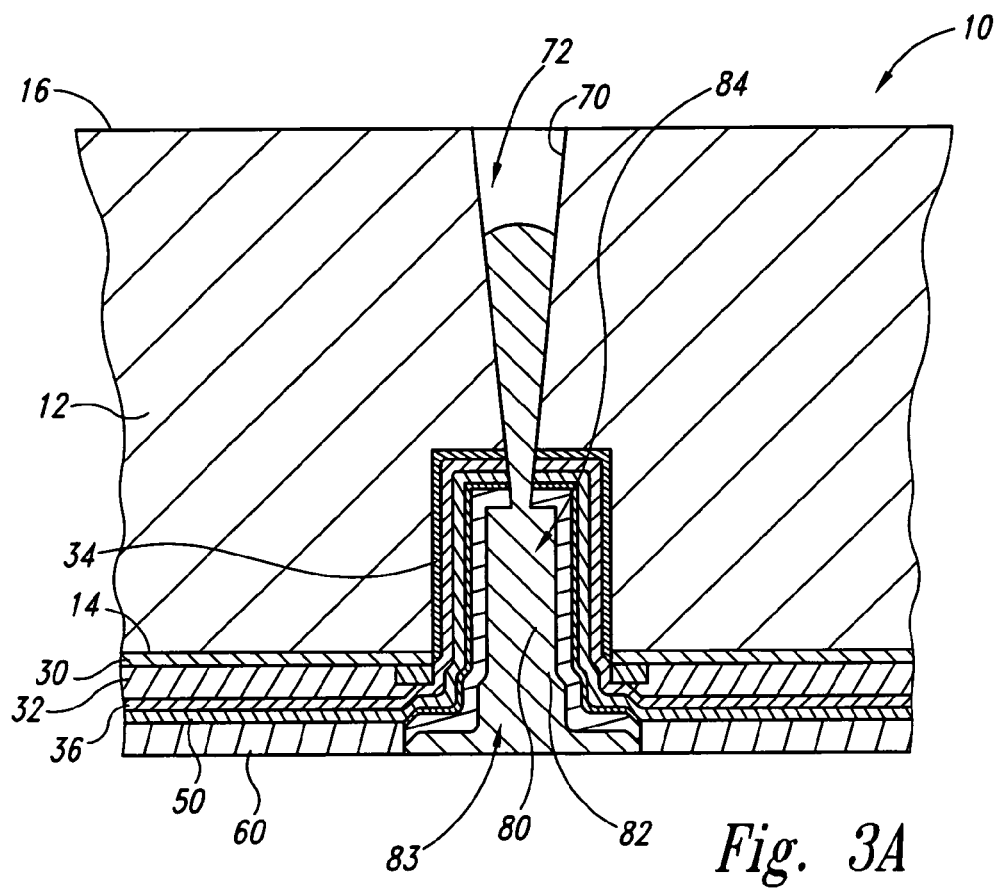
FIGS. 3A-3B are side cross-sectional views illustrating further stages in a method of forming an interconnect through a workpiece in accordance with an embodiment of the invention.
Figure 3B:
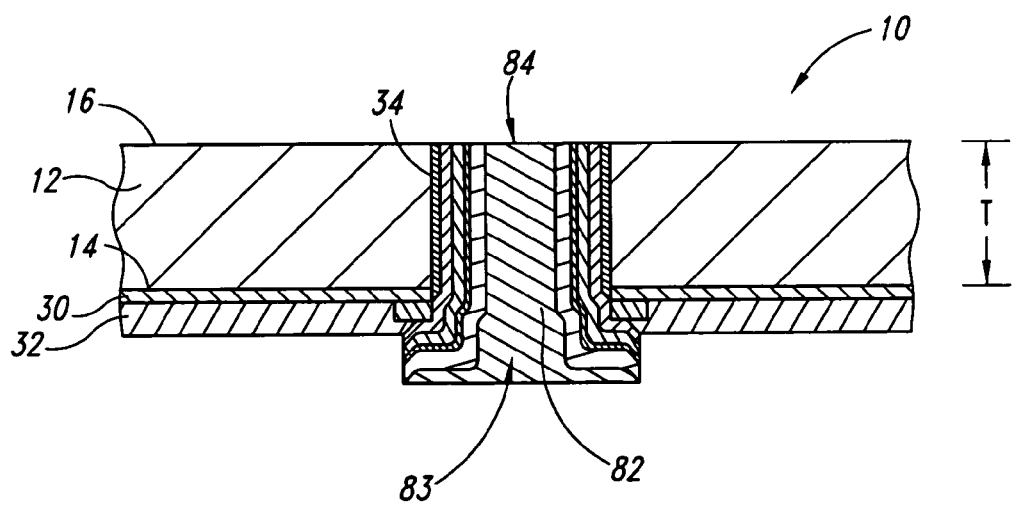

FIGS. 3A and 3B are side cross-sectional views illustrating two stages in a method for further preparation of the workpiece 10. In FIG. 3A, the conductive fill material 80 has cooled and hardened in the passage 72 to form an electrical interconnect 82 having a first end 83 and a second end 84. Referring next to FIG. 3B, the resist layer 60 (FIG. 3A) is removed from the workpiece 10 and a suitable etching process is used to remove the remaining portions of the seed layer 50 and barrier layer 36 on the first side 14 of the substrate 12. The substrate 12 can then be thinned to a desired thickness "T" by removing material from the second side 16 of the substrate 12 using grinding, dry etching, chemical etching, chemical polishing, chemical mechanical planarization (CMP), and/or other suitable techniques known in the art. In the illustrated embodiment, thinning the substrate 12 in the foregoing manner exposes the second end 84 of the interconnect 82. In one embodiment, the initial thickness of the substrate 12 (as shown in FIGS. 1A-1H) can be about 750 μm, and the final thickness T can be about 100-500 μm. In other embodiments, the initial and final thicknesses of the substrate 12 can have other values depending on various factors including the type of workpiece, application, etc.

Figure 4:
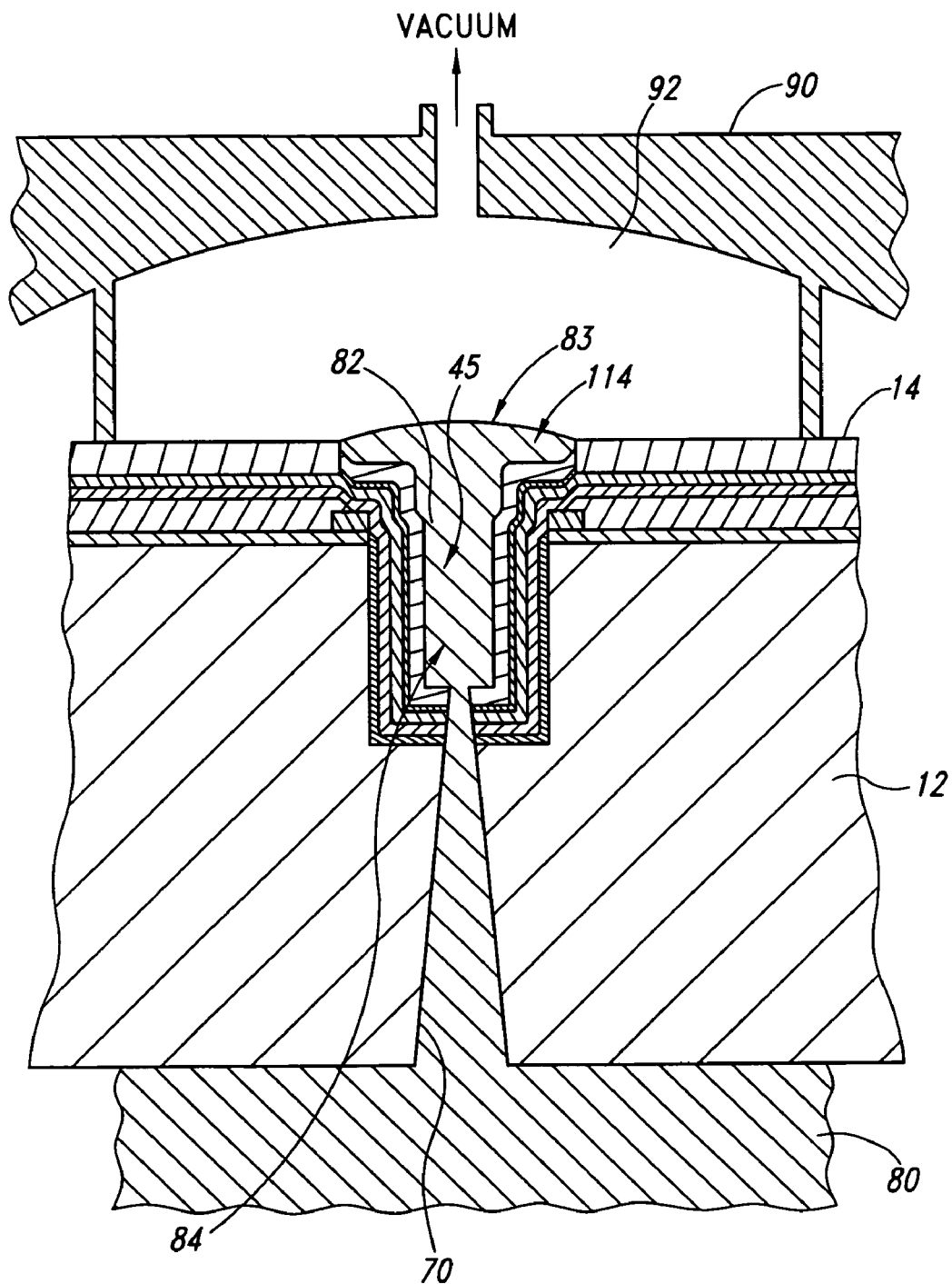
FIG. 4 is a side cross-sectional view illustrating a stage in a method of drawing conductive fill material into a blind hole in accordance with another embodiment of the invention.

FIG. 4 is a side cross-sectional view illustrating a stage in another method for filling the blind hole 45 in accordance with an embodiment of the invention. In this embodiment, the substrate 12 is again oriented as shown in FIGS. 1A-1H. The conductive fill material 80 is positioned in flowable form proximate to the second opening 116 of the vent 70. The vacuum fixture 90 is sealably positioned against the first side 14 of the substrate 12, with the interior volume 92 in fluid communication with the first opening 114 of the blind hole 45. As the interior volume 92 is evacuated, the fill material 80 is drawn, wetted, or otherwise moved into the blind hole 45 via the vent 70. In selected embodiments, the temperature of the substrate 12 can be controlled (e.g., elevated) to prevent the fill material 80 from hardening before the blind hole 45 is completely filled.

One advantage of sucking the fill material 80 from the front side of the blind hole 45 as described above with reference to FIG. 4 is that it can produce a slightly domed face on the first end 83 of the interconnect 82. In selected embodiments, such a shape may be advantageous for subsequent attachment of the first end 83 to other components such as solder balls, etc. Conversely, positioning the vacuum fixture 90 on the backside of the substrate 12 as illustrated in FIGS. 3A and 3B may, in some embodiments, result in a dished or slightly more concave first end 83.

One advantage of using a vacuum to move fill materials into blind holes or passages (whether from the front side or the backside) is that it can result in more complete filling of the hole as compared to conventional methods that do not utilize vacuum. In addition, using vacuum to draw and/or wet flux, cleaning solution, and/or some other form of surface treatment into a blind hole or passage before conductive fill material can make the inner surfaces of the hole or passage more solderable and/or more easily filled with the conductive material. Another advantage of the interconnect forming methods described above is that the vent hole 70 allows trapped air, gases, and/or volatile solvents to escape from the larger blind hole 45 as the fill material 80 flows into the blind hole.

C. Systems for Forming Interconnects in Microelectronic Workpieces

Figure 5:
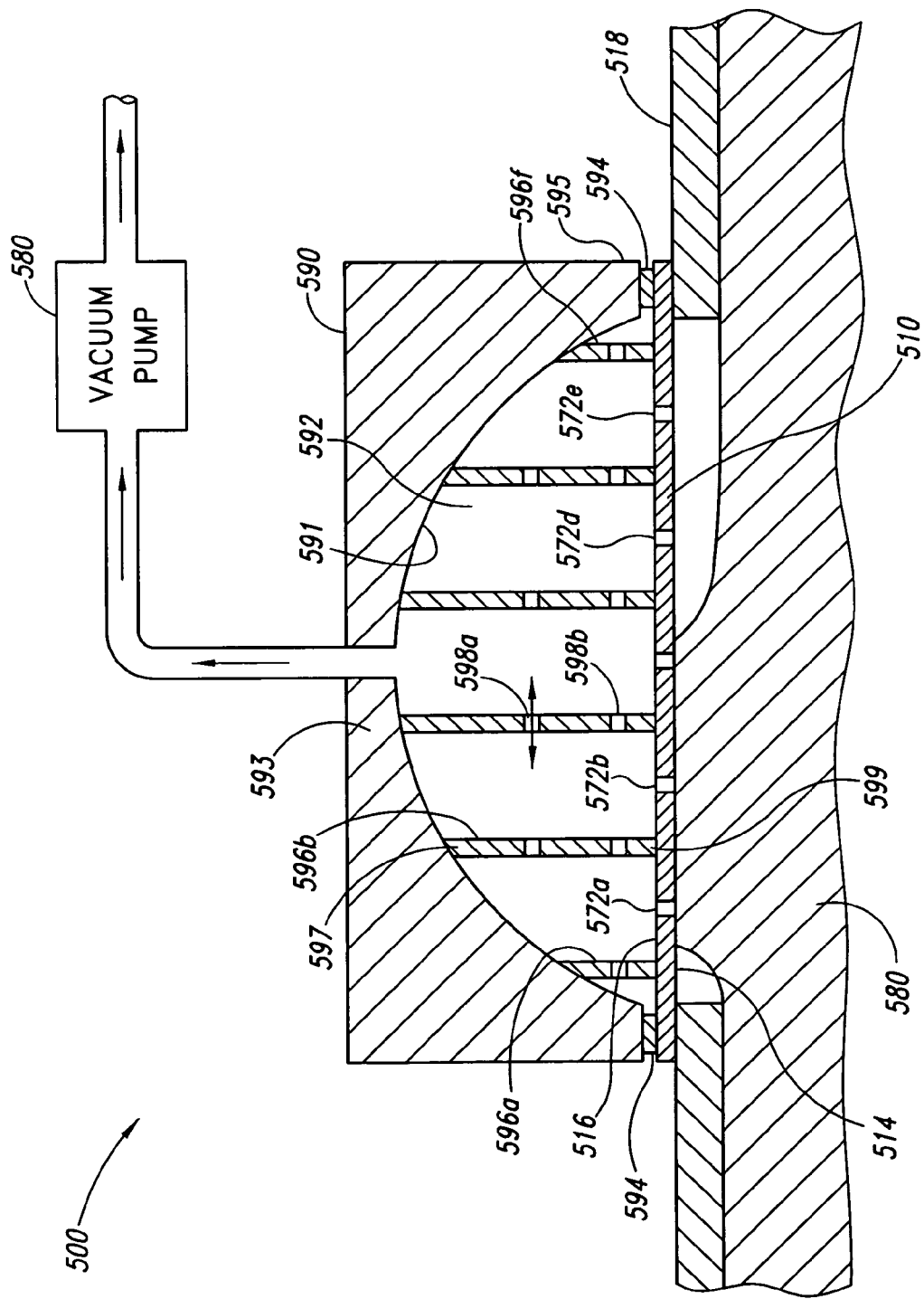
FIG. 5 is a side cross-sectional view of an assembly for manufacturing an electrical interconnect in accordance with an embodiment of the invention.

FIG. 5 is a side cross-sectional view of an assembly 500 for forming a plurality of interconnects (not shown in detail) in a microelectronic workpiece 510 in accordance with an embodiment of the invention. In one aspect of this embodiment, the microelectronic workpiece 510 includes a plurality of passages 572 (identified individually as passages 572a-f) extending through the workpiece 510 from a first side 514 to a second side 516. Although not shown in detail, each of the passages 572 can be formed by a blind hole that extends from the first side 514 and intersects a corresponding vent hole that extends from the second side 516.

In the illustrated embodiment, the workpiece 510 is supported by a carrier 518, and a vacuum fixture 590 is positioned against the second side 516 of the workpiece 510. The vacuum fixture 590 includes a body 593 having an interior wall portion 591. The interior wall portion 591 at least partially defines an interior volume 592. The interior volume 592 is positioned in fluid communication with each of the passages 572 and is operably coupled to an evacuating device 580 (e.g., a vacuum pump, etc.).

The vacuum fixture 590 further includes a base portion 595 that extends around the interior volume 592. In the illustrated embodiment, the base portion carries a compressible seal 594 (e.g., a rubber, silicone, or other type of seal) that is compressed against the second side 516 of the workpiece 510 to seal the interior volume 592. In addition, the vacuum fixture 590 can also include one or more support members 596 (identified individually as support members 596a-f) having proximal ends 597 fixedly attached to the interior wall portion 591, and corresponding distal ends 599 configured to contact the second side 516 of the workpiece 510. The support members 596 provide support for the workpiece 510 when subjected to external pressure from the evacuation process described below. Each of the support members 596 can include one or more vents or through-holes 598 for equalizing pressure in adjacent compartments of the interior volume 592 as the passages 572 become plugged with fill material.

Flowable fill material 580 is positioned against, or at least proximate to, the first side 514 of the workpiece 510. In one embodiment, the conductive fill material 580 can be flowed against the first side 514 using known wave or fountain techniques. In another embodiment, the first side 514 of the workpiece 510 can be positioned on a pool of the fill material 580. In still further embodiments, other suitable methods can be used to position the flowable fill material 580 proximate to the first side 514.

To manufacture interconnects with the assembly 500, the evacuating device 580 at least partially evacuates the interior volume 592 of the vacuum fixture 590. The reduced pressure in the interior volume 592 causes the fill material 580 to flow into the passages 572 as described above with reference to FIGS. 2A-2B. A similar process can be used to draw an oxide reducing agent or other surface treatment into each of the passages 572 before they are filled with the fill material 580. The support members 596 keep the workpiece 510 from flexing or breaking under the external pressure of the evacuation process.

Figure 6:
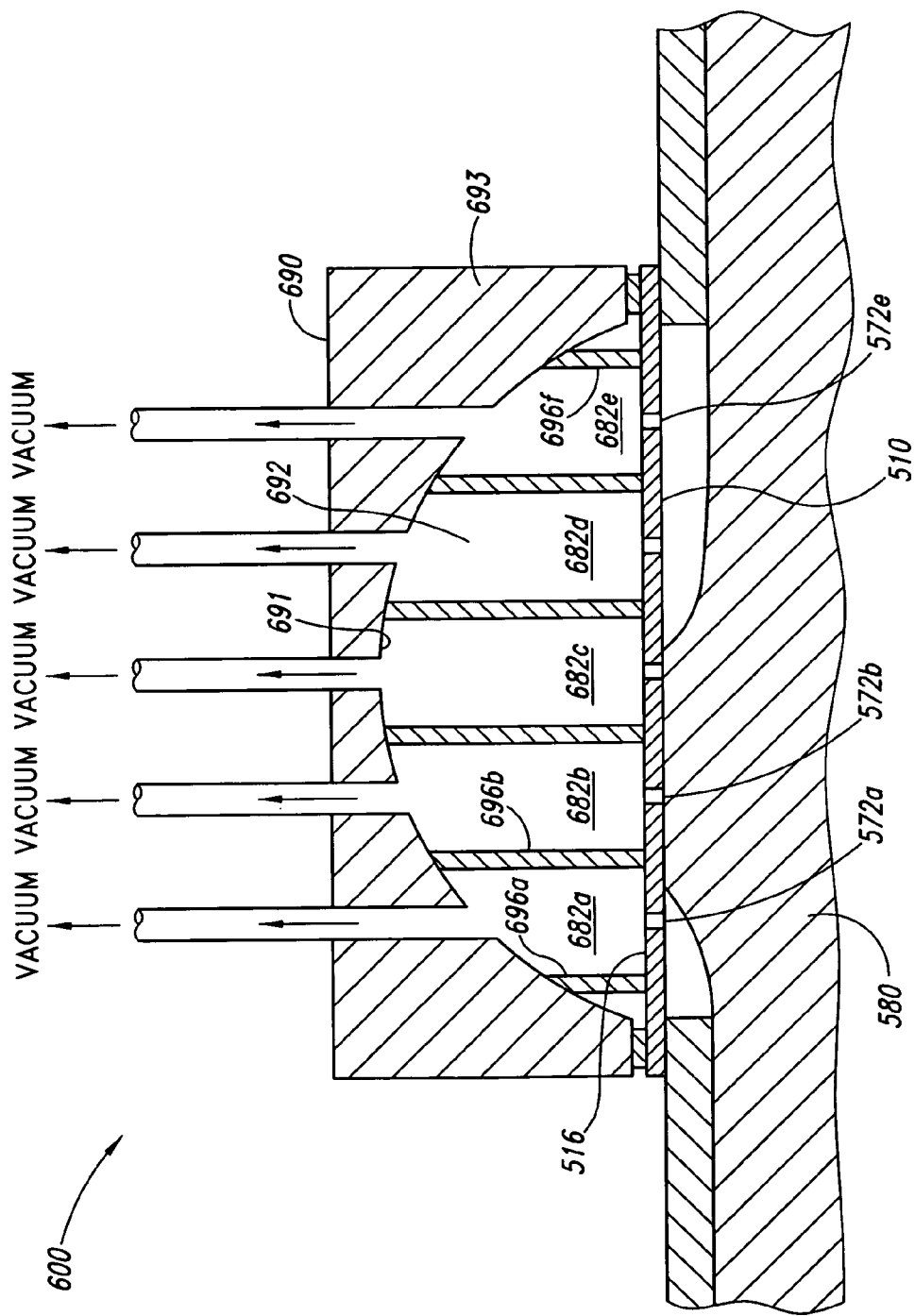
FIG. 6 is a side cross-sectional view of another assembly for manufacturing an electrical interconnect in accordance with an embodiment of the invention.

FIG. 6 is a side cross-sectional view of an assembly 600 for manufacturing interconnects in the microelectronic workpiece 510 in accordance with another embodiment of the invention. The manufacturing assembly 600 is at least generally similar in structure and function to the manufacturing assembly 500 described above with reference to FIG. 5. For example, the assembly 600 includes a vacuum fixture 690 that is releasably sealed against the second surface 516 of the workpiece 510. Further, the vacuum fixture 690 includes a plurality of support members 696 (identified individually as support member 696a-f) configured to support the workpiece 510 during evacuation of an interior volume 692.

In one aspect of this particular embodiment, however, the support members 696 are not vented, and instead form individual chambers 682 (identified individually as chambers 682a-e) in fluid communication with corresponding passages 572. Each individual chamber 682 is operably coupled to a dedicated vacuum line 684. As a result, as the passage 572 in one chamber 682 becomes plugged with the fill material 580, it will not change the vacuum pressure in the adjacent chamber 682. One advantage of this feature is that it provides more control of the vacuum across discrete regions of the interior volume 692 during the filling process to ensure that each passage is adequately filled with the conductive material 580. In contrast, one shortcoming of the vacuum fixture 590 of FIG. 5 may be that as the individual passages 572 begin to fill, the vacuum pressure in the interior volume 592 can change (e.g., it can increase) and result in different fill levels in the individual passages 572.

Figure 7:
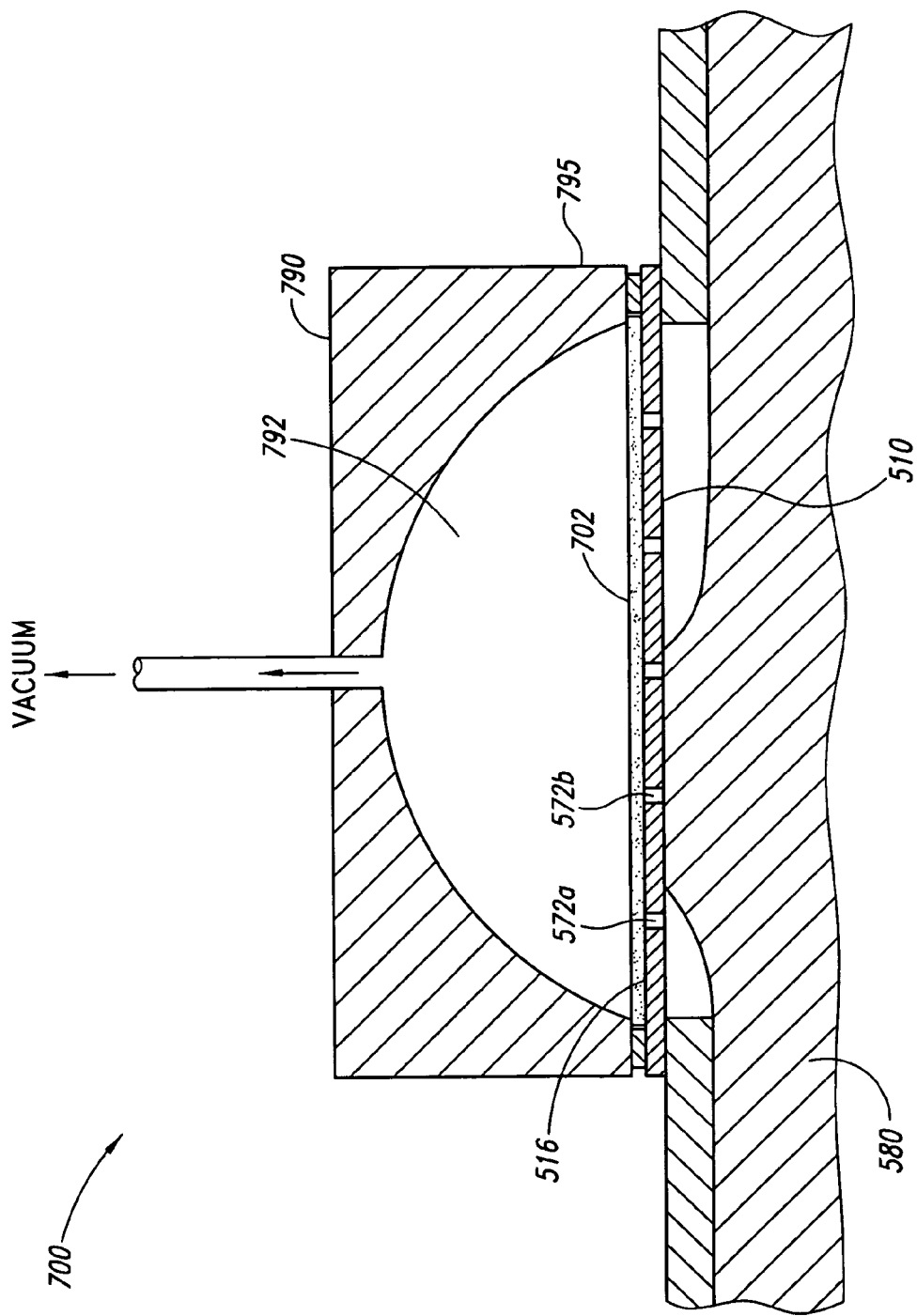
FIG. 7 is a side cross-sectional view of a further assembly for manufacturing an electrical interconnect in accordance with an embodiment of the invention.

FIG. 7 is a side cross-sectional view of an assembly 700 for manufacturing interconnects in the microelectronic workpiece 510 in accordance with a further embodiment of the invention. The manufacturing assembly 500 is at least generally similar in structure and function to the manufacturing assemblies 500 and 600 described above with reference to FIGS. 5 and 6, respectively. For example, the assembly 700 includes a vacuum fixture 790 that is releasably sealed against the second surface 516 of the workpiece 510 while an interior volume 792 is at least partially evacuated to draw the fill material 580 through the passages 572 as described above. In this particular embodiment, however, the assembly 700 further includes a vented or porous backplate 702 that provides support to the workpiece 510 during the evacuation process. In one embodiment, the porous backplate 702 can be sandwiched between a base portion 795 of the vacuum fixture 790 and the second side 516 of the workpiece 510.

As the foregoing discussion with reference to FIGS. 5-7 makes clear, there are various types of vacuum fixtures that can be used to move, wet, suck and/or draw flowable material (e.g, an oxide reducing agent, solder, etc.) through passages in microelectronic workpieces in accordance with the methods and systems disclosed herein. For example, although the vacuum fixtures 590, 690 and 790 described above are sealed against the second side 561 of the workpiece 510, in other embodiments vacuum fixtures can be sealed against adjacent carriers or support features. Similarly, although many of the embodiments described above utilize a downstream vacuum to suck the fill material through a passage, other embodiments of the invention can utilize an upstream pressure source to push the fill material through a passage. Accordingly, various embodiments of the present invention are not limited to the particular vacuum arrangements described herein, but instead extend to other systems that provide a sufficient pressure differential to move fill material into a vented passage that extends through a workpiece.

From the foregoing, it will be appreciated that specific embodiments of the invention have been described herein for purposes of illustration, but that various modifications may be made without deviating from the spirit and scope of the invention. For example, various aspects of any of the foregoing embodiments can be combined in different combinations. Additionally, even though the foregoing embodiments describe forming a through-hole by first forming a blind hole and then forming a vent to the blind hole, other through-holes formed completely through the workpiece in one process (e.g., by etching, mechanical-drilling, or laser-drilling) can be used. Accordingly, the invention is not limited, except as by the appended claims.

We claim:

1. A method of manufacturing a microelectronic workpiece having a plurality of microelectronic dies, wherein individual dies include an integrated circuit and a terminal electrically coupled to the integrated circuit, the method comprising:
   forming a though-hole through the workpiece, the through-hole extending from a first opening on a first surface of the workpiece to a second opening on a second surface of the workpiece;
   removably sealing a vacuum fixture against the second surface of the workpiece in fluid communication with the second opening; and
   at least partially evacuating an interior portion of the vacuum fixture to reduce the atmospheric pressure at the second opening relative to the atmospheric pressure at the first opening, thereby moving electrically conductive material into at least a portion of the through-hole through the first opening.

2. The method of claim 1 wherein moving electrically conductive material into at least a portion of the through-hole includes sucking the electrically conductive material into only a portion of the through-hole proximate to the first surface, and wherein the method further comprises removing material from the second surface of the workpiece.

3. The method of claim 1, further comprising moving a surface treatment into at least a portion of the through-hole before moving electrically conductive material into at least a portion of the through-hole.

4. The method of claim 1, further comprising:
   moving an oxide reducing agent into at least a portion of the through-hole; and
   elevating the temperature of the workpiece to bake out at least one of undesirable gases and moisture associated with the oxide reducing agent, before moving electrically conductive material into at least a portion of the through-hole.

5. The method of claim 1 wherein the method further comprises removing material from the second surface of the workpiece to thin the workpiece after moving electrically conductive material into at least a portion of the through-hole.

6. The method of claim 1 wherein forming a through-hole through the workpiece includes:
   forming a blind hole in the workpiece that extends from the first surface of the workpiece to an intermediate depth in the workpiece; and
   forming a vent in the workpiece in fluid communication with the blind hole.

7. The method of claim 1 wherein moving electrically conductive material into at least a portion of the through-hole includes sucking the electrically conductive material into at least a portion of the through-hole.

8. The method of claim 1 wherein moving electrically conductive material into at least a portion of the through-hole includes removing gases trapped in the through-hole to facilitate wetting of at least a portion of the through-hole with the electrically conductive material.

9. The method of claim 6 wherein moving electrically conductive material into at least a portion of the through-hole includes moving the electrically conductive material into the blind hole through the first opening, and wherein the method further comprises:

heating the electrically conductive material to make the electrically conductive material flowable;

positioning the heated, electrically conductive material at least proximate to the first opening in the first surface of the workpiece; and cooling the heated, electrically conductive material after moving the electrically conductive material into at least a portion of the blind hole to harden the electrically conductive material in the blind hole.

10. The method of claim 6 wherein moving electrically conductive material into at least a portion of the through-hole includes moving the electrically conductive material into the blind hole through the first opening, and wherein the method further comprises:

heating the electrically conductive material to make the electrically conductive material flowable;

positioning the heated, electrically conductive material at least proximate to the first opening in the first surface of the workpiece;

cooling the heated, electrically conductive material after moving the electrically conductive material into at least a portion of the blind hole to harden the electrically conductive material in the blind hole; and removing material from the second surface of the workpiece to thin the workpiece after the electrically conductive material has hardened in the blind hole.

11. The method of claim 6 wherein at least partially evacuating an interior portion of the vacuum fixture includes at least partially evacuating the vent.

12. The method of claim 6 wherein forming a vent in the workpiece includes forming a hole that extends from the second surface of the workpiece to the blind hole.

13. The method of claim 6 wherein forming a vent in the workpiece includes laser-cutting a hole that extends from the second exterior surface of the workpiece to the blind hole.

14. The method of claim 6 wherein forming a blind hole in the workpiece includes etching a hole through at least a portion of one of the terminals.

15. The method of claim 6 wherein moving electrically conductive material into at least a portion of the through-hole includes filling the blind hole with the electrically conductive material to form an interconnect.

16. The method of claim 6 wherein moving electrically conductive material into at least a portion of the through-hole includes drawing molten solder into the blind hole.

17. The method of claim 6 wherein moving electrically conductive material into at least a portion of the through-hole includes drawing at least one of Sn, Cu, Ni, Co, Ag and Au into the blind hole.

18. The method of claim 6, further comprising plating the blind hole before moving electrically conductive material into at least a portion of the through-hole.

19. The method of claim 6, further comprising:

applying a dielectric liner to at least a portion of the blind hole;

depositing a barrier layer onto the workpiece and into the blind hole over at least a portion of the dielectric liner;

depositing a seed layer onto the workpiece and into the blind hole, wherein the seed layer overlays at least a portion of the barrier layer;

applying a layer of resist over the workpiece and forming an opening over one of the terminals; and applying a conductive layer into the blind hole and over at least a portion of the seed layer before forming the vent and moving electrically conductive material into at least a portion of the through-hole.

20. The method of claim 19 wherein the method further comprises removing the layer of resist, seed layer, and barrier layer from the portion of the workpiece outside the blind hole after moving electrically conductive material into at least a portion of the through-hole and before removing material from the second surface of the workpiece to thin the workpiece.

21. A method of manufacturing a microelectronic workpiece having a plurality of microelectronic dies, wherein individual dies include an integrated circuit and a terminal electrically coupled to the integrated circuit, the method comprising:

forming a blind hole in the workpiece, the blind hole extending through one of the terminals on a first exterior surface of the workpiece to an intermediate depth in the workpiece;

forming a vent in the workpiece in fluid communication with the blind hole;

removably sealing a vacuum fixture against one of the first exterior surface and a second exterior surface of the workpiece;

at least partially evacuating an interior portion of the vacuum fixture in fluid communication with the blind hole; and filling the blind hole with electrically conductive material by sucking the electrically conductive material into the blind hole.

22. The method of claim 21 wherein filling the blind hole with electrically conductive material includes sucking the electrically conductive material into the vent and then into the blind hole.

23. The method of claim 21 wherein forming a blind hole in the workpiece includes forming a first opening in one of the terminals on the first exterior surface of the workpiece, and wherein forming a vent in the workpiece includes forming a second opening in the second exterior surface of the workpiece, wherein filling the blind hole with electrically conductive material includes sucking the electrically conductive material into the workpiece through the second opening.

24. The method of claim 21 wherein forming a blind hole in the workpiece includes forming a first opening in one of the terminals on the first exterior surface of the workpiece, and wherein forming a vent in the workpiece includes forming a second opening in the second exterior surface of the workpiece, wherein filling the blind hole with electrically conductive material includes sucking the electrically conductive material into the workpiece through the second opening, and wherein the method further comprises:

heating the electrically conductive material to make the electrically conductive material flowable;

positioning the heated, electrically conductive material at least proximate to the second opening in the second exterior surface of the workpiece; and cooling the heated, electrically conductive material after sucking the electrically conductive material into at least a portion of the blind hole to harden the electrically conductive material in the blind hole.

25. The method of claim 21 wherein forming a blind hole in the workpiece includes forming a first opening in one of the terminals on the first exterior surface of the workpiece, and wherein forming a vent in the workpiece includes forming a second opening in the second exterior surface of the workpiece, wherein filling the blind hole with electrically conductive material includes sucking the electrically conductive material into the workpiece through the second opening, and wherein the method further comprises:
- heating the electrically conductive material to make the electrically conductive material flowable;
- positioning the heated, electrically conductive material at least proximate to the second opening in the second exterior surface of the workpiece;
- cooling the heated, electrically conductive material after sucking the electrically conductive material into at least a portion of the blind hole to harden the electrically conductive material in the blind hole; and
- removing material from the second exterior surface of the workpiece to thin the workpiece after the electrically conductive material has hardened in the blind hole.

26. The method of claim 22 wherein sucking the electrically conductive material into the vent and then into the blind hole includes drawing at least a partial vacuum in the blind hole.

27. The method of claim 22 further comprising removing material from the second exterior surface of the workpiece to thin the workpiece after sucking the electrically conductive material into the vent and then into the blind hole.

28. A method of manufacturing a microelectronic workpiece having a plurality of microelectronic dies, wherein individual dies include an integrated circuit and a terminal electrically coupled to the integrated circuit, the method comprising:
- forming a though-hole through the workpiece, the through-hole extending from a first opening on a first surface of the workpiece to a second opening on a second surface of the workpiece;
- removably sealing a vacuum fixture against the second surface of the workpiece in fluid communication with the through-hole; and
- at least partially evacuating an interior portion of the vacuum fixture, thereby moving electrically conductive material into at least a portion of the through-hole by reducing the atmospheric pressure at the second opening relative to the atmospheric pressure at the first opening.

29. The method of claim 28 wherein reducing the atmospheric pressure at the second opening relative to the atmospheric pressure at the first opening includes drawing a vacuum in an interior volume removably positioned in fluid communication with the second opening.

30. The method of claim 28 wherein reducing the atmospheric pressure at the second opening relative to the atmospheric pressure at the first opening includes increasing the atmospheric pressure in an interior volume removably positioned in fluid communication with the first opening.

31. The method of claim 28 wherein forming a through-hole through the workpiece includes:
- forming a blind hole that extends from the first opening to an intermediate depth in the workpiece; and
- forming a vent that extends from the second opening to the blind hole.

32. The method of claim 28 wherein moving conductive material into at least a portion of the through-hole includes flowing molten solder through the first opening by drawing a vacuum at the second opening.

33. A method of forming an interconnect in electrical contact with a terminal on a microelectronic workpiece, the method comprising:
- forming a through-hole through the workpiece in alignment with the terminal, the through-hole extending from a front side of the workpiece to a backside of the workpiece;
- moving electrically conductive material into a first portion of the through-hole from the front side of the workpiece by drawing at least a partial vacuum in a second portion of the through-hole from the backside of the workpiece; and
- removing material from the backside of the workpiece to thin the workpiece and expose at least a portion of the electrically conductive material in the through-hole.

34. The method of claim 33 wherein forming a through-hole through the workpiece includes:
- forming a first hole in the front side of the workpiece in alignment with the terminal, wherein the first hole does not extend completely through the workpiece; and
- forming a second hole in the backside of the workpiece, wherein the second hole is in fluid communication with the first hole.

35. The method of claim 33 further comprising:
- heating the electrically conductive material to make the electrically conductive material flowable;
- positioning the heated, electrically conductive material at least proximate to the front side of the workpiece; and
- cooling the heated, electrically conductive material after moving the electrically conductive material into the first portion of the through-hole proximate to the front side of the workpiece.

36. The method of claim 33, further comprising moving a surface treatment into the first portion of the through-hole before moving the electrically conductive material into the first portion of the through-hole.

37. The method of claim 33, further comprising:
- moving an oxide reducing agent into the first portion of the through-hole; and
- elevating the temperature of the workpiece to bake out at least one of undesirable gases and moisture associated with the oxide reducing agent, before moving the electrically conductive material into the first portion of the through-hole.

38. The method of claim 33 wherein moving electrically conductive material into a first portion of the through-hole includes drawing electrically conductive material into a first portion of the through-hole proximate to the front side of the workpiece.

39. The method of claim 34 wherein forming a first hole in the front side of the workpiece includes etching a portion of the terminal, and wherein forming a second hole in the back side of the workpiece includes laser-cutting a hole through a portion of the workpiece.

40. A method of manufacturing a microelectronic workpiece, the workpiece including a substrate having a front side, a backside, and a plurality of microelectronic dies, wherein individual dies include an integrated circuit and an array of bond-pads electrically coupled to the integrated circuit, the method comprising:
- forming a plurality of through-holes through the workpiece, wherein each through-hole is aligned with a corresponding bond-pad, the through-holes extending from a front side of the workpiece to a backside of the workpiece;
- positioning electrically conductive material in a flowable state at least proximate the front side of the substrate;
- positioning an apparatus defining an interior volume against the back side of the substrate;
- at least partially evacuating the interior volume to evacuate the through-holes from the back side of the substrate and move the electrically conductive material into the through-holes from the front side of the substrate, wherein the electrically conductive material forms interconnects in contact with the corresponding bond-pads; and thinning the workpiece from the back side of the substrate to expose at least a portion of the individual interconnects.

41. The method of claim 40 wherein positioning an apparatus defining an interior volume against the back side of the substrate includes removably sealing a vacuum fixture against the back side of the substrate and at least partially evacuating an interior portion of the vacuum fixture in fluid communication with the through-holes.

42. The method of claim 40, further comprising:
heating the electrically conductive material to make the electrically conductive material flowable; and
exposing the front side of the substrate to the heated, electrically conductive material.

43. The method of claim 40 wherein forming a plurality of through-holes through the workpiece includes:
forming a plurality of blind holes in the front side of the substrate in alignment with corresponding bond-pads; and
forming a plurality of vent holes in the back side of the substrate, the individual vent holes extending through the substrate to corresponding blind holes.

44. The method of claim 40 wherein forming a plurality of blind holes in the front side of the substrate includes etching portions of the corresponding bond-pads, and wherein forming a plurality of vent holes in the backside of the substrate includes laser-cutting the plurality of vent holes.

45. The method of claim 40 wherein evacuating the through-holes from the back side of the substrate includes sucking the electrically conductive material into the through-holes from the front side of the substrate.

46. A method of forming an electrical interconnect in a microelectronic workpiece having at least one bond-pad electrically coupled to an integrated circuit, the method comprising:
forming a passage through the workpiece from a first opening on a first exterior surface of the workpiece to a second opening on a second exterior surface of the workpiece;
positioning a flowable material at least proximate to the first opening;
removably positioning a vacuum fixture against the second exterior surface of the workpiece; and
at least partially evacuating an interior volume of the vacuum fixture in fluid communication with the second opening, thereby moving the flowable material into at least a portion of the passage.

47. The method of claim 46 wherein moving the flowable material into at least a portion of the passage includes moving the flowable material into only a portion of the passage such that an adjacent portion of the passage remains unfilled by the flowable material.

48. The method of claim 46 wherein positioning a flowable material at least proximate to the first opening includes positioning oxide reducing agent at least proximate to the first opening, and wherein moving the flowable material into at least a portion of the passage includes moving the oxide reducing agent into at least a portion of the passage.

49. The method of claim 46 wherein positioning a flowable material at least proximate to the first opening includes positioning an oxide reducing agent at least proximate to the first opening, wherein moving the flowable material into at least a portion of the passage includes moving the oxide reducing agent into at least a portion of the passage, and wherein the method further comprises elevating the temperature of the workpiece to bake at least one of volatiles and moisture out of the oxide reducing agent after moving the oxide reducing agent into at least a portion of the passage.

50. The method of claim 46 wherein positioning a flowable material at least proximate to the first opening includes positioning an oxide reducing agent at least proximate to the first opening, wherein moving the flowable material into at least a portion of the passage includes moving the oxide reducing agent into at least a portion of the passage, and wherein the method further comprises:
elevating the temperature of the workpiece to bake at least one of volatiles and moisture out of the oxide reducing agent after moving the oxide reducing agent into at least a portion of the passage;
positioning a flowable, conductive material at least proximate to the first opening; and
moving the flowable, conductive material into at least a portion of the passage after the oxide reducing agent by at least partially evacuating the interior volume removably positioned in fluid communication with the second opening.

51. The method of claim 46 wherein positioning a flowable material at least proximate to the first opening includes directing molten, conductive material toward the first opening, and wherein moving the flowable material into at least a portion of the passage includes moving the conductive material into at least a portion of the passage.

52. The method of claim 46 wherein forming the passage through the workpiece includes forming a hole through at least a portion of the bond-pad, wherein moving the flowable material into at least a portion of the passage includes moving conductive material into at least a portion of the passage, and wherein the conductive material is electrically coupled to the bond-pad.

53. The method of claim 46 wherein forming a passage through the workpiece includes etching a first hole in the first exterior surface of the workpiece and laser-cutting a second hole in the second exterior surface of the workpiece.

54. The method of claim 46, further comprising removing material from the second exterior surface of the workpiece to thin the workpiece and expose at least a portion of the flowable material in the passage.

55. The method of claim 46 wherein moving the flowable material into at least a portion of the passage includes sucking the flowable material into at least a portion of the passage by at least partially evacuating the interior volume removably positioned in fluid communication with the second opening.

* * * * *